(12) United States Patent
Liu et al.

(10) Patent No.: US 10,113,111 B2
(45) Date of Patent: Oct. 30, 2018

(54) TREATED FILLERS AND USES THEREOF

(71) Applicant: Dow Corning Corporation, Midland, MI (US)

(72) Inventors: Lizhi Liu, Midland, MI (US); Steven Swier, Midland, MI (US); Yanhu Wei, Midland, MI (US)

(73) Assignee: Dow Silicones Corporation, Midland, MI (US)

( * ) Notice: Subject to any disclaimer, the term of this patent is extended or adjusted under 35 U.S.C. 154(b) by 0 days.

(21) Appl. No.: 14/828,892

(22) Filed: Aug. 18, 2015

(65) Prior Publication Data

US 2016/0230084 A1 Aug. 11, 2016

Related U.S. Application Data

(60) Provisional application No. 62/197,184, filed on Jul. 27, 2015, provisional application No. 62/192,721, filed on Jul. 15, 2015, provisional application No. 62/113,195, filed on Feb. 6, 2015.

(51) Int. Cl.
| | |
|---|---|
| C09K 11/77 | (2006.01) |
| C09K 11/02 | (2006.01) |
| H01L 33/56 | (2010.01) |
| H01L 33/50 | (2010.01) |
| C08G 77/44 | (2006.01) |
| C08G 77/08 | (2006.01) |
| C09C 1/36 | (2006.01) |
| C09C 3/08 | (2006.01) |

(52) U.S. Cl.
CPC .......... *C09K 11/7734* (2013.01); *C08G 77/08* (2013.01); *C08G 77/44* (2013.01); *C09C 1/3669* (2013.01); *C09C 3/08* (2013.01); *C09K 11/02* (2013.01); *C09K 11/025* (2013.01); *C09K 11/7721* (2013.01); *H01L 33/502* (2013.01); *H01L 33/507* (2013.01); *H01L 33/56* (2013.01)

(58) Field of Classification Search
CPC ...... C08G 77/08; C08G 77/44; C09K 11/025; C09K 11/02; C09K 11/7734; C09K 11/7721; C09C 1/5669; H01L 33/56; H01L 33/502; H01L 33/507
See application file for complete search history.

(56) References Cited

U.S. PATENT DOCUMENTS

| | | | |
|---|---|---|---|
| 4,224,524 A | 9/1980 | Suys et al. | |
| 4,689,172 A | 8/1987 | Czeiler et al. | |
| 7,202,598 B2 | 4/2007 | Juestel et al. | |
| 7,511,411 B2 | 3/2009 | Maruta et al. | |
| 8,013,057 B2 | 9/2011 | Taguchi et al. | |
| 8,455,899 B2 | 6/2013 | Taguchi et al. | |
| 2011/0182072 A1 | 7/2011 | Shimizu | |
| 2015/0329770 A1 | 11/2015 | Kaneyoshi et al. | |
| 2016/0009866 A1 | 1/2016 | Swier | |

FOREIGN PATENT DOCUMENTS

| | | | |
|---|---|---|---|
| EP | 2774966 A1 | | 9/2014 |
| JP | H02-209989 A | | 8/1990 |
| JP | H02-233794 A | | 9/1990 |
| JP | H03-231987 A | | 10/1991 |
| JP | H06-025470 | | 2/1994 |
| JP | H06-314593 A | | 11/1994 |
| JP | 2006028458 | | 2/2006 |
| JP | 2006-273904 | * | 10/2006 |
| JP | 2011-012168 | | 1/2011 |
| WO | 2007082663 A1 | | 7/2007 |
| WO | 2013090691 A1 | | 6/2013 |
| WO | 2014/152522 A1 | | 9/2014 |
| WO | WO 2014/152522 | * | 9/2014 |

OTHER PUBLICATIONS

Translation of JP 2006-273904, Oct. 12, 2006.*
English Translation of Office Action dated Dec. 7, 2015 for JP Application 2015-162669.
PCT/US15/64641 International Search Report dated Mar. 11, 2016.

* cited by examiner

*Primary Examiner* — C Melissa Koslow
(74) *Attorney, Agent, or Firm* — Steven W. Mork; Matthew T. Fewkes

(57) ABSTRACT

The various embodiments of the present invention relate to condensation curable silicone compositions comprising: a condensation curable polyorganosiloxane; and treated particles comprising a particulate solid having an effective amount of nitrogen-containing base (e.g., a nitrogen-containing superbase) disposed thereon. Other embodiments of the present invention relate to methods for preparing the aforementioned treated particles; the treated particles themselves; and methods of using the treated particles and compositions of the various embodiments of the present invention.

17 Claims, No Drawings

TREATED FILLERS AND USES THEREOF

CROSS REFERENCE TO RELATED APPLICATIONS

This US patent application is an original nonprovisional utility application filed under 35 U.S.C. § 111(a) and claims priority and benefit of U.S. Provisional Patent Application Ser. No. 62/113,195 filed 6 Feb. 2015; U.S. Provisional Patent Application Ser. No. 62/192,721 filed 15 Jul. 2015; and U.S. Provisional Patent Application Ser. No. 62/197,184 filed 27 Jul. 2015; the entire contents of each of said U.S. Provisional Patent Applications are hereby incorporated by reference.

Condensation curable silicone compositions sometimes contain particulate solids that, among other things, convert light (e.g., phosphors), reinforce, increase the refractive index; improve the barrier properties; and/or enhance the thermal conductivity of the curable silicone compositions and cured compositions derived from a condensation curable composition.

Surface treating phosphors is generally known for limited and specific applications or purposes. For example, some surface treatments may impart moisture resistance to a binder layer comprising the phosphors and a binder material when the binder layer is exposed to moisture in an end-use device. Or some surface treatments may improve dispersability of the phosphors in the binder material during mixing of the phosphors into the binder material. Some such surface treatments coat the phosphors to give coated phosphors that are core-shell particles wherein the core is the phosphor and the shell is a monolithic coating layer, which may be hydrophobic.

U.S. Pat. No. 4,689,172 to A. Czeiler et al. relates to a process of surface treating luminescent materials and to eliminating the drawbacks of certain methods of producing low-pressure discharge tubes, especially low-pressure mercury vapor discharge lamps. The luminescent material(s) optionally composed of more color components are suspended in the solution of active agent(s) and treated with 0.5 to 10% by weight of glass forming acid or a mixture thereof, preferably boric acid or phosphoric acid calculated on the weight of the luminescent material. Then a solution comprising 1 to 15% by weight of aliphatic amines calculated on the weight of the luminescent materials is added and the mixture thus obtained is homogenized. The aliphatic amine are preferably amines of 1 to 8 carbon atoms, especially n-butylamine and n-octylamine are preferred. Some of the essential requirements of said process are that the double acid-alkylamine layer makes the particles hydrophobic, and thus the luminescent material becomes easily sprayable and dischargeable, in the course of heat treatment forming part of the manufacturing process the amine is removed and evaporated without leaving any disadvantageous carbonaceous contaminations [in the discharge tubes], and the glass-forming oxide liberating during the heat treatment adheres the particles together and to the glass.

U.S. Pat. No. 8,013,057 B2 to Y. Taguchi et al. relates to a white thermosetting silicone resin composition for molding an optical semiconductor case and optical semiconductor case and to providing a composition that has excellent whiteness, consistency, and resistance to heat, light, yellowing, and warping. The optical semiconductor may be an LED. The composition comprises (A) a thermosetting organopolysiloxane, (B) a white pigment, (C) an inorganic filler (excluding the white pigment), (D) a condensation catalyst, and (E) a coupling agent represented by the following formula: $R^3{}_d Si(OR^2)_e$ wherein $R^3$ represents an organic group containing a mercapto group, a glycidyl group, or an amino group, $R^2$ represents a $C_{1-4}$ organic group, d represents 1 or 2, and e represents 2 or 3; wherein the content of the white pigment (B) is 1 to 50% by weight in the entire composition, and total content of the white pigment (B) and the inorganic filler (C) is 70 to 93% by weight in the entire composition. The condensation catalyst (D) may be a basic compound, metal containing compounds, and organo-titanium chelate compounds. The basic compound may be, among other things, trimethylbenzylammonium hydroxide, n-hexylamine, tributylamine, diazabicycloundecene, or dicyanide diamide. The condensation catalyst preferably is a certain metal containing compound or certain organo-titanium chelate compound. The composition may also incorporate other adequate additives (F) such as a whisker, a silicone powder, a thermoplastic resin, a thermoplastic elastomer, an organic synthetic rubber, an internal mold release agent, or an antioxidant. The antioxidant may be a phenol, phosphor, or sulfur antioxidant. Some of the essential requirements of said composition is that when cured it has excellent whiteness, consistency, and resistance to heat, light, yellowing, and warping.

U.S. Pat. No. 8,455,899 B2 to Y. Taguchi et al. relates to a resin composition, reflector for light-emitting semiconductor device, and light-emitting semiconductor unit and to providing a cured product that can retain whiteness, heat resistance, moisture resistance and light resistance, is uniform, does not undergo much yellowing, has a reflectance of 80% or higher in a wavelength range of 300 to 500 nm, is low in deflection upon curing, and is effective for molding a reflector for a light-emitting semiconductor device. The resin composition comprises 100 parts by weight of an organic resin and 50 to 1,000 parts by weight of an inorganic filler, wherein 10 to 100% of the inorganic filler is composed of an oxide of a rare earth element. The organic resin may be a polyphthalamide, epoxy or silicone resin. The silicone resin can be condensation curable or addition-curable thermosetting silicone resins. The condensation curable thermosetting silicone resin composition may comprise such a silicone resin and a condensation catalyst. The condensation catalyst may be a basic compound, metal containing compounds, and organo-titanium chelate compounds. The basic compound may be, among other things, trimethylbenzylammonium hydroxide, n-hexylamine, tributylamine, diazabicycloundecene, or dicyanide diamide. The condensation catalyst preferably is a certain metal containing compound or certain organo-titanium chelate compound. In addition to the light-emitting semiconductor and the reflector made of the cured product, the light-emitting device may also include a sealant for sealing the light-emitting semiconductor. The sealant is separate and distinct from the cured product of the reflector. The light-emitting semiconductor may be sealed with a transparent resin or a transparent resin that includes a phosphor. The transparent resin may be a transparent silicone resin, optionally with a phosphor incorporated therein. The transparent silicone resin with a phosphor incorporated therein may be heated and cured, for example, at 120° C. for one hour and then at 150° C. for two hours. Some of the essential requirements of said cured product is that it has heat resistance, moisture resistance and light resistance, is uniform, does not undergo much yellowing, has a reflectance of 80% or higher in a wavelength range of 300 to 500 nm, and is low in deflection.

WO 2013/090691 A1 to S. Swier relates to curable compositions of "resin-linear" organosiloxane block copolymers comprising a superbase catalyst are disclosed. The addition of a superbase catalyst to compositions of certain resin-linear organosiloxane block copolymers results in curable compositions having faster cure rates, and improved mechanical strength and/or thermal stability over similar compositions without the superbase catalyst.

EP 2 774 966 A1 to M. Kaneyoshi et al. relates to a method for surface treatment of phosphor. The phosphor is a red phosphor in the form of a Mn-activated complex fluoride having the formula: $A_2MF_6$:Mn wherein M is one or more tetravalent elements selected from Si, Ti, Zr, Hf, Ge, and Sn, and A is one or more alkali metals selected from Li, Na, K, Rb, and CS, and contains at least Na and/or K. The surface of the phosphor is treated with a treating solution containing a surface treating agent selected from an organic amine, quaternary ammonium salt, alkyl betaine or fluorochemical surfactant, alkoxysilane, and fluorinated polymer. The organic amine may have the formula (2): $NR^1R^2R^3$ (2) wherein at least one of $R^1$, $R^2$, and $R^3$ is a substituted or unsubstituted monovalent hydrocarbon group, and the remainder is hydrogen. The substituted monovalent hydrocarbon group is substituted by fluorine atoms or other radicals. The organic amine may be a primary, secondary or tertiary amine as long as it meets formula (2). Preferably the organic amine is a relatively highly hydrophobic compound, i.e., a less water-soluble compound is preferred. The monovalent hydrocarbon group may be a saturated aliphatic group (e.g., alkyl) or an unsaturated aliphatic group; straight or branched or contain an intermediate carbocycle, with a straight group being preferred. Examples of suitable organic amines include, among other things, methylamine, hexylamine, octadecylamine, dimethylamine, dioctylamine, n-propyl-n-butylamine, trimethylamine and trihexylamine. Some of the essential requirements of said phosphor treatment method is improving the humidity resistance (i.e., air moisture resistance) of a phosphor by using a surface treating agent that is strongly adsorbed to the surface of the red phosphor while the surface treating agent possesses hydrophobic groups such as hydrocarbon groups that exhibit hydrophobic properties.

SUMMARY

Various embodiments of the present invention relate to, among other things, contacting a particulate solid with a composition comprising a nitrogen-containing base to give treated particles having an effective amount of nitrogen-containing base disposed (e.g., absorbed or adsorbed) thereon. Various embodiments also relate to, among other things, the treated particles, compositions comprising the treated particles and at least one other ingredient, and methods of using the treated particles and compositions.

DETAILED DESCRIPTION OF THE EMBODIMENTS

The Brief Summary and the Abstract are hereby incorporated by reference. All U.S. patent application publications and patents referenced below, or a portion thereof if only the portion is referenced, are hereby incorporated herein by reference to the extent that the incorporated subject matter does not conflict with the present description, which would control in any such conflict.

The description of this invention uses certain terms and expressions. As used herein, "alternatively" refers to a separate and distinct embodiment. "Contacting" means bringing into physical contact. "Operative" means functionally effective, wherein the effect may be a direct effect, alternatively an indirect affect. For example, reactants may be brought into direct physical contact in a reaction thereof, with or without a catalyst; and components of an article or device may be brought into "operative contact," which includes direct physical touching, alternatively indirect touching via one or more intermediary components. "Optionally" means is absent, alternatively is present. Any Markush group comprising a genus and subgenus therein includes the subgenus in the genus, e.g., in "R is hydrocarbyl or alkenyl," R may be alkenyl, alternatively R may be hydrocarbyl, which includes, among other subgenuses, alkenyl. As used herein, "may" confers a choice, not an imperative. All "molecular weight" of a macromolecular material, such as a number average molecular weight ($M_n$) or weight average molecular weight ($M_w$) of a polymer, is determined using gel permeation chromatography and polystyrene standards unless noted herein otherwise. "Silicone" includes linear, branched, or a mixture of linear and branched polyorganosiloxane macromolecules. All "wt %" (weight percent) are, unless otherwise noted, based on total weight of all ingredients or constituents used to make the composition or formulation, which adds up to 100 wt %.

We made the present invention during our research into solving a problem we observed wherein some condensation curable compositions containing particulate solids such as phosphors either did not cure at an appreciable cure speed or cured too slowly to be useful in high volume manufacturing processes, such as those used in the light-emitting diode (LED) industry. Another problem we observed that using too much condensation catalyst in such condensation curable compositions causes the compositions to have cure speeds that are too high and to cure too quickly to be useful in many manufacturing operations such as encapsulating integrated circuits (IC) or LEDs ICs and LEDS typically are of varying shapes, heights and sizes. Encapsulating ICs and LEDs requires an encapsulant material be able flow over and cover these components in an encapsulation before curing has proceeded to an extent where viscosity becomes too high and adequate flow is prevented by the change in rheology of the encapsulant material. Thus rheology of the composition and cure speed of the composition are two problems to be solved. Compositions that have cure speeds that are too high cannot finish covering ICs and LEDs before they become viscous and unworkable. After a lot of research and insight we discovered a new technical solution to the problem. The applications for our technical solution to this problem are not limited to phosphors, to condensation curable compositions, or to cure speed.

In terms of potential of hydrogen (pH), condensation catalysts tend to be basic compounds. The inventors have discovered that particulate solids comprised in condensation curable silicone compositions can negatively impact, among other things, the curing speed of such compositions. At first the reason for this observation was unknown, but we found that the particulate solids, especially those having acidic sites on their surfaces, can absorb or adsorb the curing catalyst (e.g., condensation catalyst) used to cure the condensation curable silicone compositions. Absorption or adsorption of the curing catalyst (e.g., on acidic sites on the surface of the particulate solid), in turn, can result in a reduction of the amount of curing catalyst available for curing and/or a reduction of the catalyst's activity in curing the condensation curable silicone composition, such that the curing speed of the condensation curable silicone composition is significantly reduced compared to the curing speed of comparative condensation curable silicone compositions that contain the curing catalyst, but lack (i.e., are free of) the particulate solids. This discovery is surprising given the relatively small amount of acidic sites on the surfaces of the particles relative to the amount of condensation curable silicone composition.

This curing problem is not solved by a non-invention method of adding too little of an amount of the nitrogen-containing base (e.g., DBU) to a mixture of a condensation curable polyorganosiloxane and untreated phosphor particles because the phosphor particles would not be sufficiently neutralized. Also, if all of the added nitrogen-containing base migrates to the surface of the phosphor particles, too little or none would be available to catalyze condensation curing of the condensation curable polyorganosiloxane. Also, the rheology problem is not solved by a non-invention method of adding too great of an amount of the nitrogen-containing base (e.g., DBU) to a mixture of a condensation curable polyorganosiloxane and untreated phosphor particles because the excess of nitrogen-containing base in the composition would accelerate curing increase viscosity thereof, and thereby prevent the composition from flowing over ICs and LEDs and encapsulating them. Also, an excess of said base could cause degradation of a cured product prepared by curing the composition. Until we discovered these problems and fathomed their sources, a technical solution could not have been made or predicted. Further, even with the problems discovered and their sources appreciated, the technical solution is not clear. For example, we found that simple in situ addition of a nitrogen-containing base (e.g., DBU) to a mixture of a condensation curable polyorganosiloxane and untreated phosphor particles results in said mixture having either too little or too much of said base to solve both of the curing problems.

The present invention relates to treated particles comprising a particulate solid having an effective amount of a nitrogen-containing base (e.g., a nitrogen-containing superbase) disposed (e.g., absorbed or adsorbed) thereon. The amount is effective for solving the curing and rheology problems we described above. The amount is effective because the quantity is not too little that the particulate solid would not be sufficiently neutralized such that cure speed would not be enhanced and the quantity is not too great that the condensation curable silicone composition would cure too fast before it can flow over ICs or LEDs. Thus, the effective amount is a rheology and cure speed-controlling effective amount, and is simply referred to as an effective amount. Further, the total amount of the nitrogen-containing base disposed on the particulate solid of the treated particles plus any catalytically effective amount of a condensation catalyst disposed in the condensation curable silicone composition but not on the particulate solid is such that the time necessary for the condensation curable silicone composition to cure and reach a tan delta value=1 is at least 30 seconds, but not so much that the time is greater than 65 minutes at 150° C., alternatively at 140° C., alternatively at 130° C., alternatively at 120° C.

The effective amount of the nitrogen-containing base (e.g., a nitrogen-containing superbase) of the treated particles may be obtained by any suitable method. In some embodiments the effective amount is obtained by the present method of preparing the treated particles, such as treated filler particles or treated phosphor particles. In some embodiments the treated particles are prepared by a method comprising contacting untreated particles with the nitrogen-containing base, either in neat form (liquidous or vaporous base) or optionally in the presence of a solvent (as in a delivery composition described later) to give treated particles comprising a particulate solid having an excess amount of nitrogen-containing superbase disposed thereon. The solvent may be an organic solvent and/or water. Next, the treated particles having the excess amount of nitrogen-containing superbase disposed thereon are separated from any gross excess of base and/or from any solvent to give isolated treated particles having an excess amount or reduced excess amount of nitrogen-containing superbase disposed thereon. The separation may be by any suitable means such as filtering the isolated treated particles, evaporating the solvent from the isolated treated particles, or freeze drying the isolated treated particles. Then the isolated treated particles are further processed to remove the excess amount of the nitrogen-containing base without removing too much thereof, that is to remove some, but not all of the nitrogen-containing base, therefrom, to give processed treated particles. The processed form of the treated particles have an effective amount of the nitrogen-containing base disposed thereon. Additionally, the processed form of the treated particles may have substantially all or all of the acidic sites of the source untreated particles neutralized by the nitrogen-containing base, but the particles themselves may not contain so much base that they would contain a monolithic coating or film of the nitrogen-containing base over the entire surface of the particles.

The term "base" does not refer to a supporting layer or structure. The term "nitrogen-containing base" means a molecule containing at least one element having atomic number 7, or a collection of such molecules, wherein the at least one element having atomic number 7 is a basic nitrogen atom in that it has an available lone pair of electrons for accepting a hydrogen cation (a proton) or for donating the lone pair of electrons to a Lewis acid to form a Lewis adduct. A nitrogen atom wherein its lone pair of electrons is tied up in a pi-bond, such as in acetamide ($CH_3CONH_2$) or pyrrole, is not counted as being a basic nitrogen atom for this purpose. In some embodiments the nitrogen-containing base is a nitrogen-containing superbase as described later. As used herein "disposed" refers to a physical contact of the nitrogen-containing base with the surface of the particulate solid. That physical contact results in an interaction with acidic functional groups on the surface and may be obtained by any suitable mechanism such as adhesion, permeation, (partial) dissolution, surface tension, or a combination thereof. In some embodiments disposed means absorbed, alternatively adsorbed, alternatively a combination of absorbed and adsorbed. In some embodiments disposed includes adsorption that is classified as physisorption (e.g., adhesion via van der Waals forces), alternatively as chemisorption (e.g., adhesion via bonding other than van der Walls forces such as hydrogen bonding and/or ionic bonding).

In some embodiments the utility and benefits of the treated particles relates to their use in and benefits for condensation curable compositions such as condensation curable silicone compositions or condensation curable organic compositions (e.g., a diester monomer and diamine monomer for condensation curing to make polyamides; a polyisocyanate and a diol monomer for condensation curing to make polyurethanes; or a dianhydride monomer and a diol monomer for condensation curing to make polyesters). The following description details the condensation curable compositions in relation to condensation curable silicone compositions, but the invention is not limited to such compositions, but rather it also includes the condensation curable organic compositions. The following description details those uses and benefits. The utility and benefits of the treated particles, however, are not limited to condensation curable compositions, but additionally include uses with any acid sensitive material, especially a material that is prone to degrade or decompose via acid facilitated or enhanced mechanisms. In some embodiments the invention relates to a non-curable composition comprising a mixture of an acid sensitive material and the treated particles. Additionally, the utility and benefits of the treated particles include uses and benefits with materials that are not acid sensitive, such as uses and benefits in modulating color or optical transmittance by or through said non-acid sensitive materials. In some embodiments the invention relates to a composition comprising a mixture of a non-acid sensitive material and the treated particles.

In some embodiments, the present invention relates to a condensation curable silicone composition comprising: a condensation curable polyorganosiloxane; and treated particles comprising a particulate solid having an amount of a nitrogen-containing base disposed thereon; wherein the amount of nitrogen-containing base disposed on the particulate solid is sufficient to neutralize a substantial number of a plurality of acidic sites on the particulate solid and a substantial number of the acidic sites on the particulate solid are neutralized with the disposed nitrogen-containing base.

In some embodiments, when cured the inventive condensation curable silicone composition may beneficially have increased curing speed compared to the curing speed of a comparative condensation curable silicone composition that contains an untreated particulate solid instead of the treated particles. Curing speed may be measured using any suitable method. In some embodiments curing speed is measured as the time necessary for the condensation curable silicone composition to cure and reach a tan delta value equal to 1. Tan delta equals loss modulus divided by storage modulus. The tan delta value reflects the energy dissipation potential of a viscoelastic material as the ratio of the viscous to elastic response of the viscoelastic material. All other things being equal, the more fluid-like a material is the higher its loss modulus, and the more solid-like the material is the higher its storage modulus. As curing of the material proceeds, tan delta begins decreasing from a tan delta >1 downward to eventually the material is cured and reaches tan delta=1. All other conditions (e.g., cure temperature) being equal, the faster the curing speed, the shorter the time needed by the condensation curable silicone composition to cure and reach the tan delta value equal to 1.

In some embodiments, the effective amount of nitrogen-containing base disposed on the particulate solid is sufficient so that the time necessary for the condensation curable silicone composition to cure and reach a tan delta value equal to 1 is from about 30 seconds (s) to about 1 hour (e.g., from about 1 minute to about 30 minutes; about 5 minutes to about 30 minutes; about 2 minutes to about 30 minutes; about 10 minutes to about 45 minutes; or about 15 minutes to about 1 hour) at 150° C. During these measurements the condensation curable silicone composition is heated from ambient temperature (e.g., 23° C.) to the target temperature of 150° C. In some embodiments the condensation curable silicone composition cures with such curing speed that it reaches a tan delta value equal to 1 before the composition can reach 150° C. In such fast curing embodiments, the target temperature can be lowered, e.g., to 140° C., or 130° C., or 120° C., or lower if needed, such that the target temperature is reached before the composition cures and reaches a tan delta value equal to 1. When the time necessary for the condensation curable silicone composition to cure and reach a tan delta value equal to 1 is as defined above, it means that a substantial number of the acidic sites on the particulate solid are, in fact, neutralized with the disposed nitrogen-containing base. In other words, one can determine that a substantial number of the acidic sites on the particulate solid are, in fact, neutralized with the disposed nitrogen-containing base indirectly, via rheological measurements.

Alternatively or additionally, one can determine that a substantial number of the acidic sites on the particulate solid are neutralized with the disposed nitrogen-containing base by way of other analytical techniques generally known in the art. See, e.g., Foo, K. Y., et al., Chem. Eng. J. 156: 2-10 (2010); and Langmuir, I., J. Am. Chem. Soc. 38: 2221-2295 (1916). Briefly, for example, 1,8-diazabicyclo[5.4.0]undec-7-ene (DBU) can be serially diluted in high-performance liquid chromatography (HPLC) grade toluene to create a series of DBU solutions. The solutions can be prepared in any suitable container, e.g., polypropylene bottles. An aliquot of phosphor particles is then mixed with an aliquot of each DBU solution at the same weight/weight ratio (e.g., 1 g phosphor to 8 g solution) in polyethylene centrifuge tubes. The mixtures are then continuously tumbled for 30 minutes followed by centrifuging at about 3,000 revolutions per minute (rpm) for 5 to 15 minutes. The supernatants are then diluted and analyzed by electrospray ionization mass spectrometry (ESI-MS) for quantification of the effective amount of DBU disposed on the phosphor particles. The results are used to generate Langmuir Adsorption Isotherm curves. The curves define a saturation point. The saturation point is defined as the DBU concentration in the treated phosphor particles (μg DBU/g phosphor), where the lowest level of DBU is detected in the supernatant. That is, the saturation point reflects an equilibrium reaction where the amount of free DBU (or any other nitrogen-containing base) in the toluene solution is detectable using the analytical method. The effective amount of DBU (or any other nitrogen-containing base) that is disposed (e.g., adsorbed) on the phosphor particles at the saturation point is a function of the equilibrium reaction. Calibration standards of DBU are prepared in toluene. The calibration standards and samples are flow injected into 80% isopropyl alcohol in water and sprayed directly into the electrospray (ESI) ionization chamber. Mass Hunter Analysis Quantitative Software, version B.06, published by Agilent Technologies can be used for quantitative analysis.

The effective amount of the nitrogen-containing base may vary depending on the specific nitrogen-containing base used, the specific particulate solid used to prepare the treated particles, and the acidic nature of the particular particulate solid being used. The acidic nature may be the total number of acidic sites of the particulate solid or the areal concentration of the acidic sites per unit weight of the particulate solid. It is well within the abilities of a skilled artisan to determine without undue experimentation an effective amount of the nitrogen-containing base for a particular circumstance or composition using the present method of making the treated particles. For example, the treated particles may be prepared with an excess amount of the nitrogen-containing base, isolated and further processed to remove said excess amount to give processed treated particles having substantially all or all of the acidic sites neutralized by the nitrogen-containing base. Such processed treated particles have an effective amount of the nitrogen-containing base disposed thereon.

As used herein, the term "nitrogen-containing base" means a chemical species or molecular entity having an element of atomic number 7 that has an available pair of electrons capable of forming a covalent bond with a proton (i.e., aspects where the nitrogen-containing base is a Brøn- sted base) or forming a covalent bond with the vacant orbital of some other species having a vacant orbital (a Lewis acid) such as a metal ion (i.e., aspects where the nitrogen-containing base is a Lewis base).

The nitrogen-containing base may have one basic nitrogen atom per molecule, two basic nitrogen atoms per molecule, or three or more basic nitrogen atoms per molecule (e.g., from 3 to 5 basic nitrogen atoms, alternatively 3, alternatively 4, alternatively 5).

Nitrogen-containing bases having only one basic nitrogen atom per molecule are referred to herein as monoamines and are exemplified by compounds such as octylamine, dioctylamine, tertiary-butylamine, morpholine, piperidine, N-methyl-piperidine, 3,4,5,6-tetrahydropyridine, aniline, pyridine, acetone methylimine ($CH_3C(=NCH_3)CH_3$), N,N-dicyclohexylmethylamine, N,N-dimethylaniline, N,N-diethylaniline, N,N-diisopropyl-2-ethylbutylamine, N,N-diisopropylmethylamine, N,N-diisopropyl-3-pentylamine, 2,6-di-tert-butyl-4-methylpyridine, quinuclidine, 2,2,6,6-tetramethylpiperidine, pempidine, tributylamine, triethylamine, N-ethyldiisopropylamine, 2,4,6-tri-tert-butylpyridine, and tris(trimethylsilyl)amine. In some embodiments the nitrogen-containing base has one basic nitrogen atom per molecule. In some embodiments the nitrogen-containing base is a monocyclic aliphatic compound having one basic nitrogen atom per molecule; alternatively the nitrogen-containing base is a monocyclic aliphatic compound having one nitrogen atom per molecule, the one nitrogen atom being a basic nitrogen atom; alternatively the nitrogen-containing base is a monocyclic aliphatic compound having one nitrogen atom per molecule, the one nitrogen atom being a basic nitrogen atom and being the nitrogen atom of a carbon-nitrogen double bond (C=N).

Nitrogen-containing bases having two or more basic nitrogen atoms per molecule are referred to herein as polyfunctional amines. Polyfunctional amines are exemplified by polyamines, guanidines, diazamonocyclic hydrocarbons, diazabicyclic hydrocarbons, triazabicyclic hydrocarbons, triazabicyclic hydrocarbons, tetraazatricylic hydrocarbons (e.g., hexamethylenetetramine), and the like. As used herein a polyamine has two or more primary amino groups (—$NH_2$ groups) per molecule such as ethylene diamine, spermine, and tris(2-aminoethyl)amine. In some embodiments the nitrogen-containing base has 2 or more basic nitrogen atoms per molecule, alternatively 2 or 3 basic nitrogen atom per molecule, alternatively 4 or more basic nitrogen atoms per molecule, alternatively 4 or 5 basic nitrogen atoms per molecule, alternatively 4 basic nitrogen atoms per molecule, alternatively 3 basic nitrogen atoms per molecule, alternatively 2 basic nitrogen atoms per molecule. In some of such embodiments the nitrogen-containing base has 4 or 5 nitrogen atoms per molecule, all of which are basic nitrogen atoms; alternatively the nitrogen-containing base has 4 nitrogen atoms per molecule, all of which are basic nitrogen atoms; alternatively the nitrogen-containing base has 3 nitrogen atoms per molecule, all of which are basic nitrogen atoms; alternatively the nitrogen-containing base has 2 nitrogen atoms per molecule, all of which are basic nitrogen atoms.

The nitrogen-containing base may consist only of nitrogen, carbon and hydrogen atoms; alternatively the nitrogen-containing base may contain at least one nitrogen atom and at least one heteroatom selected from halogen, oxygen, sulfur, and phosphorous; alternatively halogen, oxygen, and phosphorous; alternatively halogen and oxygen; alternatively phosphorous and oxygen; alternatively halogen; alternatively oxygen; alternatively phosphorous. The nitrogen-containing base may be acyclic, alternatively cyclic. The cyclic nitrogen-containing base may be monocyclic, alternatively polycyclic. The polycyclic nitrogen-containing base may be bicyclic, alternatively tricyclic. The nitrogen-containing base may be aliphatic, alternatively aromatic. The aliphatic nitrogen-containing base may lack (may be free of) carbon-carbon double bonds and carbon-carbon triple bonds, alternatively the aliphatic nitrogen-containing base may contain at least one carbon-carbon double bond or carbon-carbon triple bond. The nitrogen-containing base may have a molecular weight of from 70 to 2,000 grams per mole (g/mol), alternatively from 80 to 1,000 g/mol, alternatively from 100 to 750 g/mol. The nitrogen-containing base may be a liquid or solid, alternatively a solid, alternatively a liquid. The nitrogen-containing base may have a boiling point from 50° to 500° C., alternatively from 60° to 350° C., alternatively from 70° to 250° C. Nitrogen-containing bases that can be used to treat a particulate solid and obtain treated particles comprising a particulate solid having an effective amount of nitrogen-containing base disposed thereon include nitrogen-containing bases of the general formula $R_3N$, wherein each R is independently hydrogen, alkyl or aryl, with the proviso that at least one R group is alkyl or aryl. Examples of nitrogen-containing bases of the general formula $R_3N$ include n-hexylamine, triethylamine, and tributylamine.

The term "alkyl" as used herein refers to straight chain and branched univalent saturated hydrocarbon groups having from 1 to 30 carbon atoms, 10 to 30 carbon atoms, 12 to 18 carbon atoms, 1 to about 20 carbon atoms, 1 to 10 carbons, 1 to 8 carbon atoms 1 to 5 carbon atoms or from 1 to 3 carbon atoms; and cyclic univalent saturated hydrocarbon groups (cycloalkyl groups) having from 3 to 10 carbon atoms. Examples of straight chain alkyl groups include those with from 1 to 8 carbon atoms such as methyl, ethyl, n-propyl, n-butyl, n-pentyl, n-hexyl, n-heptyl, n-octyl groups. Examples of straight chain alkyl groups include those with from 10 to 30 carbon atoms such as n-decyl, n-undecyl, n-dodecyl, n-hexadecyl, n-icosyl, and the like. Examples of branched alkyl groups include isopropyl, isobutyl, sec-butyl, t-butyl, neopentyl, isopentyl, 2,2-dimethylpropyl, and isostearyl groups. Examples of cycloalkyl groups include cyclobutyl, cyclopentyl, and cyclohexyl groups. Alkyl groups can be unsubstituted or substituted one or more times with, for example, hydroxy, alkoxy (e.g., $C_1$-$C_{30}$ alkoxy) groups, and halogen atoms. In some aspects all alkyl groups are unsubstituted; in other aspects at least one alkyl group is substituted.

The term "aryl" as used herein refers to a univalent group that is derived by removing a hydrogen atom from an arene, which is a cyclic aromatic hydrocarbon. In some embodiments, aryl groups contain 6 to about 30 carbons in the ring portions of the groups (e.g., 6 to 30, 6 to 26, 6 to 20, 6 to 14, 6 to 10 carbons, 12 carbons, 10 carbons or 6 carbons). Thus aryl groups include phenyl, azulenyl, biphenyl, indacenyl, fluorenyl, phenanthrenyl, triphenylenyl, pyrenyl, naphthacenyl, chrysenyl, biphenylenyl, anthracenyl, and naphthyl groups. Preferred examples of aryl groups are phenyl, naphthyl, or biphenyl; alternatively biphenyl; alternatively naphthyl; alternatively phenyl. Aryl groups can be unsubstituted or substituted, as defined herein. Representative substituted aryl groups can be mono-substituted or substituted more than once, such as di-, tri-, and tetra-substituted groups. Aryl groups can be unsubstituted or substituted one or more times with, for example, hydroxy, alkoxy (e.g., $C_1$-$C_{30}$ alkoxy)

groups, and halogen atoms. In some aspects all aryl groups are unsubstituted; in other aspects at least one aryl group is substituted In some embodiments, the nitrogen-containing base used to treat a particulate solid and obtain treated particles is a polyfunctional organic amine containing at least one bridgehead nitrogen atom. In some embodiments the nitrogen-containing base is a polyfunctional organic imine containing at least one carbon-nitrogen double bond (C=N), preferably being of formula $R^1R^2C=NR^3$, such as an amidine, a guanidine, or a polyfunctional cycloaliphatic imine containing at least one ring having at least one C=N double bond. In some aspects the nitrogen-containing base is a polyfunctional cycloaliphatic imine containing at least one ring having at least one C=N double bond and at least one bridgehead nitrogen atom. In some embodiments the nitrogen-containing base is a polyfunctional organic phosphazene containing at least one phosphorous-nitrogen double bond (P=N), preferably being of formula $R^1R^2P=NR^3$. In each formula, at least one of $R^1$, $R^2$, and $R^3$ is independently an azahydrocarbyl and any remaining $R^1$, $R^2$, and $R^3$ is independently $(C_1-C_{30})$alkyl, $(C_3-C_{30})$cycloalkyl, or $(C_7-C_{30})$aralkyl; or one of $R^1$, $R^2$, and $R^3$ is independently an aza$(C_1-C_{30})$alkyl, aza$(C_3-C_{30})$cycloalkyl, or aza$(C_7-C_{30})$aralkyl and the other two of $R^1$, $R^2$, and $R^3$ are bonded together to form a $(C_1-C_{30})$alkylene; or one of $R^1$, $R^2$, and $R^3$ is independently a $(C_1-C_{30})$alkyl, $(C_3-C_{30})$cycloalkyl, or $(C_7-C_{30})$aralkyl and the other two of $R^1$, $R^2$, and $R^3$ are bonded together to form an aza$(C_1-C_{30})$alkylene. In some embodiments $R^3$ is independently $(C_1-C_{30})$alkyl, $(C_3-C_{30})$cycloalkyl, or $(C_7-C_{30})$aralkyl and $R^1$ and $R^2$ are bonded together to form —$R^1$—$R^2$—, which is an aza$(C_1-C_{30})$alkylene; or $R^1$ is independently $(C_1-C_{30})$alkyl, $(C_3-C_{30})$cycloalkyl, or $(C_7-C_{30})$aralkyl and $R^2$ and $R^3$ are bonded together to form —$R^2$-$R^3$—, which is an aza$(C_1-C_{30})$alkylene; or $R^2$ is independently $(C_1-C_{30})$alkyl, $(C_3-C_{30})$cycloalkyl, or $(C_7-C_{30})$aralkyl and $R^1$ and $R^3$ are bonded together to form —$R^1$—$R^3$—, which is an aza$(C_1-C_{30})$ alkylene. In some embodiments one of $R^1$, $R^2$, and $R^3$ is independently aza$(C_1-C_{30})$alkyl; or $R^3$ is independently an aza$(C_1-C_{30})$alkyl and $R^1$ and $R^2$ are bonded together to form —$R^1$—$R^2$—, which is a $(C_1-C_{30})$alkylene; or $R^1$ is independently an aza$(C_1-C_{30})$alkyl and $R^2$ and $R^3$ are bonded together to form —$R^2$-$R^3$—, which is a $(C_1-C_{30})$alkylene; or $R^2$ is independently an aza$(C_1-C_{30})$alkyl and $R^1$ and $R^3$ are bonded together to form —$R^1$—$R^3$—, which is a $(C_1-C_{30})$ alkylene.

The term "azahydrocarbyl" means a nitrogen atom has formally replaced a C—H group in a corresponding hydrocarbyl group that the aza prefix is modifying (e.g., a C—H group in alkyl, cycloalkyl, and aralkyl is replaced by N in azaalkyl, azacycloalkyl, and azaaralkyl, respectively). The azahydrocarbyl may be unsubstituted or substituted as described earlier for alkyl substitution. An unsubstituted azahydrocarbyl consists of C, H and N atoms.

Examples of aza$(C_1-C_{30})$alkyl are aza$(C_{21}-C_{30})$alkyl, aza$(C_{11}-C_{20})$alkyl, aza$(C_1-C_{10})$alkyl, aza$(C_1-C_7)$alkyl, aza$(C_2-C_7)$alkyl, am inomethyl, am inoethyl, methylaminoethyl, butylaminoethyl, and pentylamino. Examples of aza$(C_3-C_{30})$cycloalkyl are aza$(C_{21}-C_{30})$cycloalkyl, aza$(C_{11}-C_{20})$cycloalkyl, aza$(C_3-C_{10})$cycloalkyl, aza$(C_3-C_7)$cycloalkyl, aza$(C_5-C_7)$cycloalkyl, aziridyn-1-yl, aziridin-2-yl, azetidin-1-yl, azetidin-3-yl, a pyrrolidinyl, a piperidinyl, and a morpholinyl. Examples of aza$(C_7-C_{30})$aralkyl are aza$(C_{21}-C_{30})$aralkyl, aza$(C_{11}-C_{20})$aralkyl, aza$(C_7-C_{10})$aralkyl, aza$(C_7-C_8)$aralkyl, 1-naphthylmethylamino, 1-naphthylaminomethyl, benzylamino, and 2-phenylaminoethyl. Examples of aza$(C_1-C_{30})$alkylene are aza$(C_{21}-C_{30})$alkylene, aza$(C_{11}-C_{20})$alkylene, aza$(C_1-C_{10})$alkylene, aza$(C_2-C_{10})$alkylene, aza$(C_2-C_7)$alkylene, aza$(C_3-C_7)$alkylene, —N(H)—, am inoethylene (—NHCH$_2$CH$_2$—), 2-azapropylene (—CH$_2$NHCH$_2$—), 2-methylazapropylene (—CH$_2$N(CH$_3$)CH$_2$—), 1-azabutylene (—NHCH$_2$CH$_2$CH$_2$—), 2-azabutylene (—CH$_2$NHCH$_2$CH$_2$—), 3-azahexylene (—CH$_2$CH$_2$NHCH$_2$CH$_2$CH$_2$—), and 4-azaheptylene (—CH$_2$CH$_2$CH$_2$NHCH$_2$CH$_2$CH$_2$—). In some embodiments at least one of the aza$(C_1-C_{30})$alkyl, aza$(C_3-C_{30})$cycloalkyl, aza$(C_7-C_{30})$aralkyl and aza$(C_2-C_{30})$alkylene groups independently may be substituted as described above; alternatively each of the aza$(C_1-C_{30})$alkyl, aza$(C_3-C_{30})$cycloalkyl, aza$(C_7-C_{30})$aralkyl and aza$(C_2-C_{30})$alkylene groups is unsubstituted.

Examples of $(C_1-C_{30})$alkyl are $(C_{21}-C_{30})$alkyl, $(C_{11}-C_{20})$alkyl, $(C_1-C_{10})$alkyl, $(C_1-C_7)$alkyl, $(C_2-C_7)$alkyl, methyl, ethyl, propyl, butyl, pentyl, hexyl, and heptyl. Examples of $(C_3-C_{30})$cycloalkyl are $(C_{21}-C_{30})$cycloalkyl, $(C_{11}-C_{20})$cycloalkyl, $(C_3-C_{10})$cycloalkyl, $(C_3-C_7)$cycloalkyl, $(C_5-C_7)$cycloalkyl, cyclopropyl, cyclobutyl, cyclopentyl, cyclohexyl, and cycloheptyl. Examples of $(C_7-C_{30})$aralkyl are $(C_{21}-C_{30})$aralkyl, $(C_{11}-C_{20})$aralkyl, $(C_7-C_{10})$aralkyl, $(C_7-C_8)$aralkyl, 1-naphthylmethyl, 2-naphthylmethyl, benzyl, and 2-phenylethyl. Examples of $(C_1-C_{30})$alkylene are $(C_{21}-C_{30})$alkylene, $(C_{11}-C_{20})$alkylene, $(C_1-C_{10})$alkylene, $(C_2-C_{10})$alkylene, $(C_2-C_7)$alkylene, $(C_3-C_7)$alkylene, methylene (—CH$_2$—), ethylene (—CH$_2$CH$_2$—), propylene (—CH$_2$CH$_2$CH$_2$—), 1-methylethylene (—CH(CH$_3$)CH$_2$—), butylene (—CH$_2$CH$_2$CH$_2$CH$_2$—), 2-methylpropylene (—CH$_2$CH(CH$_3$)CH$_2$—), pentylene (—CH$_2$CH$_2$CH$_2$CH$_2$CH$_2$—), hexylene (—CH$_2$CH$_2$CH$_2$CH$_2$CH$_2$CH$_2$—), and heptylene (—CH$_2$CH$_2$CH$_2$CH$_2$CH$_2$CH$_2$CH$_2$—). In some embodiments at least one of the $(C_1-C_{30})$alkyl, $(C_3-C_{30})$cycloalkyl, $(C_7-C_{30})$aralkyl and $(C_2-C_{30})$alkylene groups independently may be substituted as described above; alternatively each of the $(C_1-C_{30})$alkyl, $(C_3-C_{30})$cycloalkyl, $(C_7-C_{30})$aralkyl and $(C_2-C_{30})$alkylene groups is unsubstituted.

Nitrogen-containing bases that can be used to treat a particulate solid and obtain treated particles comprising a particulate solid having an effective amount of nitrogen-containing base disposed thereon also include nitrogen-containing bases of the general formula:

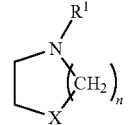

wherein X is CH$_2$ or NR$^1$, wherein each R$^1$ is independently hydrogen or alkyl or two R$^1$ groups can be taken together to form a —(CH$_2$)$_p$— group; subscript n is 1, 2 or 3; and subscript p is 1, 2 or 3. In some embodiments at least one of n and p is 2 or 3 In some embodiments X is CH$_2$ or NR$^1$, wherein each R$^1$ is hydrogen or two R$^1$ groups can form a —(CH$_2$)$_p$— group; subscript n is 1, 2 or 3; and subscript p is 1, 2 or 3. In some embodiments at least one of n and p is 2 or 3. In some embodiments X is NR$^1$. When X is NR$^1$, the general formula is an aspect of the polyfunctional amine having two basic nitrogen atoms per molecule. Examples of such nitrogen-containing bases pyrrolidine, piperidine, piperazine, quinuclidine, and 1,4-Diazabicyclo[2.2.2]octane (DABCO), having the structure:

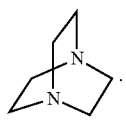

Other nitrogen-containing bases (e.g., nitrogen-containing superbases) that are aspects of the polyfunctional amine and can be used to treat a particulate solid and obtain treated particles comprising a particulate solid having an effective amount of nitrogen-containing base disposed thereon also include nitrogen-containing bases that are cycloaliphatic imines of the general formula:

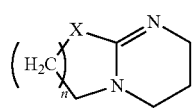

wherein X is $CH_2$ or NR, wherein R is hydrogen, alkyl or aryl, alternatively H or $CH_3$, alternatively H, alternatively $CH_3$; and subscript n is an integer from 1 to 3. Such compounds are examples of so-called hindered amine bases. In some embodiments X is $CH_2$. When X is $CH_2$, the general formula is an aspect of the polyfunctional amine (a cyclic amidine) having two basic nitrogen atoms per molecule. In some embodiments X is NR. When X is NR, the general formula is an aspect of the polyfunctional amine having three basic nitrogen atoms per molecule. Such nitrogen-containing bases are examples of nitrogen-containing superbases described later. Examples of such hindered amine bases include 1,8-Diazabicyclo[5.4.0]undec-7-ene (DBU; when X is $CH_2$; and n is 3); 1,5,7-Triazabicyclo[4.4.0]dec-5-ene (TBD; when X is NR; R is hydrogen; and n is 2); 7-Methyl-1,5,7-triazabicyclo[4.4.0]dec-5-ene (MTBD; when X is NR; R is $CH_3$; and n is 2); and 1,5-Diazabicyclo[4.3.0]-5-nonene (DBN; when X is $CH_2$; and n is 1).

Still other nitrogen-containing bases that are aspects of the polyfunctional amine and can be used to treat a particulate solid and obtain treated particles comprising a particulate solid having an effective amount of nitrogen-containing base disposed thereon also include nitrogen-containing bases of the general formula:

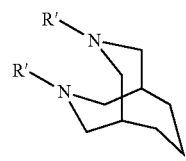

wherein each R' is independently hydrogen or alkyl. Examples of such bases include bispidine, when both R' groups are hydrogen. The general formula is an aspect of the polyfunctional amine having two basic nitrogen atoms per molecule.

Yet other nitrogen-containing bases that are aspects of the polyfunctional amine and can be used to treat a particulate solid and obtain treated particles comprising a particulate solid having an effective amount of nitrogen-containing base disposed thereon also include nitrogen-containing bases (guanidines) of the general formula:

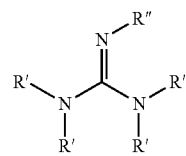

wherein each R' is independently hydrogen or alkyl; and wherein R" is hydrogen or alkyl. The general formula is an aspect of the polyfunctional amine having two basic nitrogen atoms per molecule. In some embodiments, each R' is $CH_3$ and R" is hydrogen. E.g., 2-tert-butyl-1,1,3,3-tetramethylguanidine.

Yet other nitrogen-containing bases that are aspects of the polyfunctional amine and can be used to treat a particulate solid and obtain treated particles comprising a particulate solid having an effective amount of nitrogen-containing base disposed thereon also include phosphorous-containing compounds of general formulas:

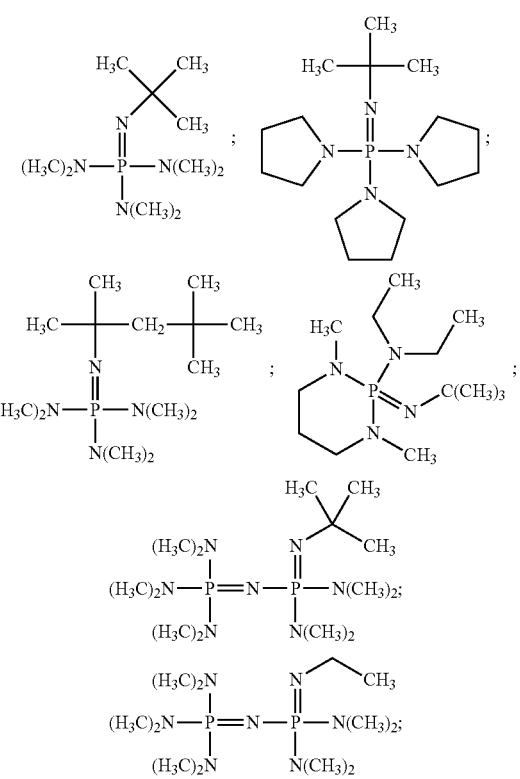

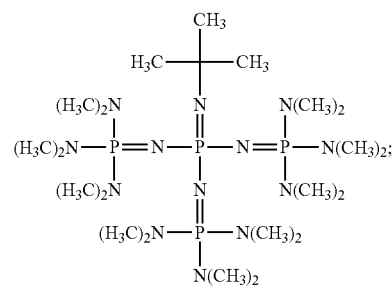

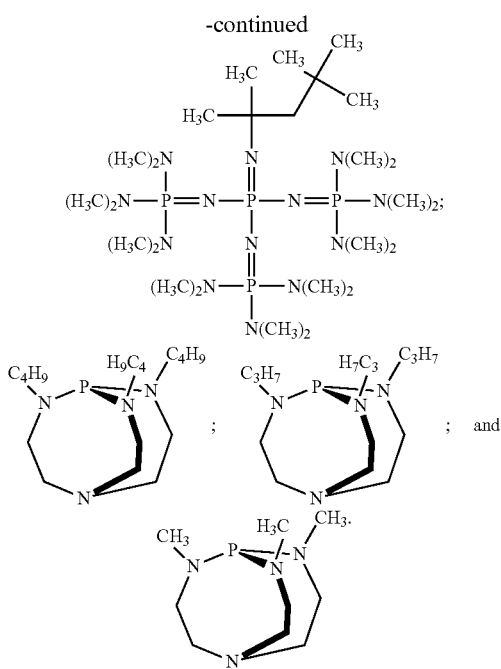

The general formulas are aspects of the polyfunctional amine having four or more basic nitrogen atoms per molecule.

Yet other nitrogen-containing bases that are aspects of the polyfunctional amine and can be used to treat a particulate solid and obtain treated particles comprising a particulate solid having an effective amount of nitrogen-containing base disposed thereon also include amidines; 1,5,7-triazabicyclo(4.4.0)dec-5-ene; 7-methyl-1,5,7-triazabicyclo(4.4.0)dec-5-ene; 1,5-diazabicyclo(4.3.0)non-5-ene; 3,3,6,9,9-pentamethyl-2,10-diazabicyclo-(4.4.0)dec-1-ene; and N,N,N'N'-tetramethyl-1,8-naphthalenediamine. See, e.g., U.S. Pat. No. 7,504,442, which is incorporated by reference as if fully set forth herein. See also Superbases for Organic Synthesis: Guanidines, Amidines, Phosphazenes and Related Organocatalysts (Tsutomu Ishikawa ed; 2009) for additional polyfunctional amine-type nitrogen-containing bases, such as additional guanidines, amidines, and phosphazenes that can be used to treat a particulate solid and obtain treated particles comprising a particulate solid having an effective amount of nitrogen-containing base disposed thereon and that are sometimes referred to as "superbases."

IUPAC defines a "superbase" as a compound, such as lithium diisopropylamide, having very high basicity (The Gold Book, International Union of Pure and Applied Chemistry). As used herein the term "superbase" means a nitrogen-containing base having a boiling point (b.p.) greater than 200° C. and a logarithmic acid dissociation constant, pKa, in acetonitrile >24. Alternatively, the pKa is ≥12.0 in water. In some embodiments the pKa≥25 (acetonitrile), alternatively pKa≥25 (acetonitrile), alternatively pKa≥26 (acetonitrile), alternatively pKa≥27 (acetonitrile), alternatively pKa≥28 (acetonitrile), alternatively pKa≥29 (acetonitrile), alternatively pKa≥30 (acetonitrile); and in some embodiments pKa<40 (acetonitrile), alternatively pKa<36 (acetonitrile), alternatively pKa<30 (acetonitrile). In some embodiments the b.p.>200° C., alternatively >230° C., alternatively >240° C., alternatively >250° C., alternatively >259° C.; and in some embodiments the boiling point is also <400° C., alternatively <350° C., alternatively <300° C., alternatively <290° C., alternatively <280° C., alternatively <270° C. For short, the superbase may be referred to herein as a "nitrogen-containing superbase."

In some embodiments the nitrogen-containing superbase used to treat a particulate solid and obtain the treated particles is at least one of: the polyfunctional organic imine containing at least one carbon-nitrogen double bond (C=N); at least one of the polyfunctional organic imine of the formula $R^1R^2C=NR^3$, wherein $R^1$, $R^2$ and $R^3$ are as defined above; at least one of an amidine; at least one of the guanidine of the general formula:

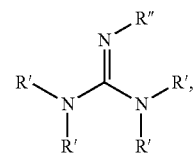

wherein R' and R" are as defined above; at least one of the polyfunctional cycloaliphatic imine containing at least one ring having at least one C=N double bond; at least one of the polyfunctional cycloaliphatic imine containing at least one ring having at least one C=N double bond and at least one bridgehead nitrogen atom; or at least one of the cycloaliphatic imine of the general formula:

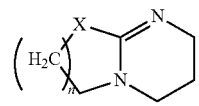

wherein X and subscript n are as defined above. In some embodiments the nitrogen-containing superbase is the polyfunctional organic imine containing at least one carbon-nitrogen double bond (C=N); alternatively the nitrogen-containing superbase is the polyfunctional organic imine of the formula $R^1R^2C=NR^3$, wherein $R^1$, $R^2$ and $R^3$ are as defined above; alternatively the nitrogen-containing superbase is the amidines; alternatively the nitrogen-containing superbase is the guanidine of the above general formula wherein R' and R" are as defined above; alternatively the nitrogen-containing superbase is the polyfunctional cycloaliphatic imine containing at least one ring having at least one C=N double bond; alternatively the nitrogen-containing superbase is the polyfunctional cycloaliphatic imine containing at least one ring having at least one C=N double bond and at least one bridgehead nitrogen atom; alternatively the nitrogen-containing superbase is the cycloaliphatic imine of the above general formula wherein X and subscript n are as defined above.

In some embodiments, the nitrogen-containing base (e.g., nitrogen-containing superbase) used to treat a particulate solid and obtain treated particles is at least one of 1,8-Diazabicyclo[5.4.0]undec-7-ene (DBU); 1,5,7-Triazabicyclo[4.4.0]dec-5-ene (TBD); 1,1,3,3-Tetramethylguanidine (TMG); 1,5-Diazabicyclo[4.3.0]-5-nonene (DBN); and 7-Methyl-1,5,7-triazabicyclo[4.4.0]dec-5-ene (MTBD). In some embodiments, the nitrogen-containing base used to treat a particulate solid and obtain treated particles is at least one of DBU, TBD, TMG, and DBN; alternatively at least one of DBU, TBD, TMG, and MTBD; alternatively at least one of DBU, TBD, DBN, and MTBD; alternatively at least one of DBU, TBD, TMG, DBN, and MTBD; alternatively at least one of DBU, TMG, DBN, and MTBD; alternatively at least one of TBD, TMG, DBN, and MTBD. In some embodiments, the nitrogen-containing base used to treat a particulate solid and obtain treated particles is at least one of TMG. In some embodiments, the nitrogen-containing base used to treat a particulate solid and obtain treated particles is at least one of DBU, TBD, DBN, and MTBD. In some embodiments, the nitrogen-containing base used to treat a particulate solid and obtain treated particles is at least one of DBU, and DBN. In some embodiments, the nitrogen-containing base used to treat a particulate solid and obtain treated particles is at least one of TBD and MTBD. In some embodiments, the nitrogen-containing base used to treat a particulate solid and obtain treated particles is at least one of DBU and TBD; alternatively at least one of DBU; alternatively at least one of DBU and TMG; alternatively at least one of DBU and DBN; alternatively at least one of DBU and MTBD. In some embodiments, the nitrogen-containing base used to treat a particulate solid and obtain treated particles is at least one of DBN and TBD; alternatively at least one of DBN; alternatively at least one of DBN and TMG; alternatively at least one of DBN and MTBD. In some embodiments, the nitrogen-containing base is at least one of DBU and DBN.

The nitrogen-containing superbase, used in the effective amount, enhances the cure speed of curing of the condensation curable silicone composition compared to a non-invention composition that is the same except it lacks or is free of the nitrogen-containing superbase. For example, the nitrogen-containing superbase, used in the effective amount, enhances the cure speed of curing of the condensation curable silicone composition compared to a non-invention composition that is the same except it lacks or is free of any nitrogen-containing base or compared to a composition that is the same except it has a nitrogen-containing base, such as an acyclic saturated amine, which is not a superbase. Examples of such acyclic saturated amines that are not a superbase are butylamine, dioctylamine, and trihexylamine. Without being bound by theory, it is believed that the cure speed of curing of the condensation curable silicone composition is enhanced by the nitrogen-containing superbase, used in the effective amount and functioning to substantially neutralize, alternatively to neutralize the acidic functional groups on the surface of the particulate solid in the treated particles. It is also believed the cure speed of curing of the condensation curable silicone composition is enhanced even further when the effective amount comprises an additional amount (a measured additional amount) of the same nitrogen-containing superbase or when the effective amount comprises a measured additional amount of a different nitrogen-containing superbase is used as the condensation catalyst in the condensation curable silicone composition. The enhancement of cure speed of curing of the condensation curable silicone composition may be due to one or more characteristics of the nitrogen-containing superbase that is/are not found in the nitrogen-containing bases that are not superbases. Examples of these characteristics include strong basicity in an organic solvent such as acetonitrile, high de-sorption temperature, low volatility, high solubility in organosiloxanes, and high catalytic activity in a condensation curing reaction. High basicity in an organic solvent such as acetonitrile may be a dominant factor, and high temperature de-sorption and/or low volatility along with the high catalytic activity may contribute to the enhanced cure speed in complementary ways. Nevertheless, the cure speed is not enhanced so much that the condensation curable silicone composition cannot flow over and cover a thing to be encapsulated such as an IC or LED before it begins to cure and become too viscous. For example, the effective amount of the nitrogen-containing superbase is not so great such that its concentration in the condensation curable silicone composition causes said composition to cure and undergo a concomitant premature change in rheology that would prevent said composition from completely encapsulating an IC or LED.

In addition to a primary control of rheology and cure speed using the effective amount of the nitrogen-containing base (e.g., nitrogen containing superbase), in some embodiments secondary factors of the nitrogen-containing base may be adjusted for nudging the time for the condensation curable silicone composition to cure and reach tan delta=1. Examples of such secondary factors of the nitrogen-containing base are its basicity, its de-sorption character, its volatility or vapor pressure, its solubility in organosiloxanes, and/or its catalytic activity in the condensation curing of the condensation curable silicone composition. In some embodiments the nitrogen-containing superbase has high basicity in an organic solvent such as acetonitrile. High basicity in an organic solvent such as acetonitrile is characteristic of the nitrogen-containing bases that provide strong bonding to acidic functional groups on the surface of the particulate solid and to SiOH groups on the organosiloxane constituents in the condensation curable silicone composition and/or SiOH groups in the silicone matrix of the cured product of curing thereof. To characterize the nitrogen-containing base by its basicity, it is convenient to measure the acidity of its conjugate acid form, particularly a mono-protonated nitrogen-containing base. For example, if the nitrogen-containing superbase is 1,8-diazabicyclo[5.4.0]undec-7-ene (DBU), its mono-protonated conjugate acid form is $[(DBU)-H]^+$. All other things being equal, the stronger the basicity of the nitrogen-containing base (nitrogen-containing superbase), the weaker the acidity of its conjugate acid form, and vice versa. The acidity of the conjugate acid form may be conveniently expressed as its pKa. The higher the pKa of the conjugate acid form, the weaker the acidity of the conjugate acid form and the stronger the basicity of the nitrogen-containing base (nitrogen-containing superbase). Although pKa is most commonly measured in water, the pKa that best illustrates the basicity of the nitrogen-containing superbase is measured in a solvent that more closely resembles the environment experienced by the nitrogen-containing base (nitrogen-containing superbase) in use in a present method or composition. An organic solvent such as acetonitrile is suitable therefor. In some embodiments the conjugate acid form of the nitrogen-containing superbase has a pKa≥20 (acetonitrile), alternatively pKa≥21 (acetonitrile), alternatively pKa21 (acetonitrile), alternatively pKa≥22 (acetonitrile), alternatively pKa≥23 (acetonitrile), alternatively pKa≥24 (acetonitrile), alternatively pKa≥25 (acetonitrile), alternatively pKa<40 (acetonitrile), alternatively pKa≥36 (acetonitrile), alternatively pKa>30 (acetonitrile). Alternatively, the pKa is ≥12.0 in water.

Alternatively or additionally to having a high basicity, the nitrogen-containing superbase does not de-sorb from an isolated treated particulate solid (e.g., from the processed treated particles) at temperatures below 120° C., alternatively below 150° C., alternatively below 180° C., alternatively below 200° C. Low de-sorption is advantageous for keeping the nitrogen-containing superbase bonded to the surface of the particulate solid in the condensation curable silicone composition, especially during curing thereof, which curing often is carried out at cure temperatures of 120° C. or higher.

Alternatively or additionally to having high basicity in an organic solvent such as acetonitrile and a high de-sorption temperature, the nitrogen-containing superbase has low volatility. Low volatility is advantageous for keeping the nitrogen-containing superbase in the condensation curable silicone composition during curing thereof, which curing often is carried out at cure temperatures of 120° C. or higher. Volatility relates to vapor pressure or boiling point of the nitrogen-containing superbase. In some embodiments the nitrogen-containing superbase has a boiling point (b.p.) >200° C., alternatively >230° C., alternatively >240° C., alternatively >250° C., alternatively >259° C.; and in some embodiments the boiling point is also <400° C., alternatively <350° C., alternatively <300° C., alternatively <290° C., alternatively <280° C., alternatively <270° C.

Alternatively or additionally to having a high de-sorption temperature, high basicity in an organic solvent such as acetonitrile, and low volatility, the nitrogen-containing superbase may also have adequate solubility in organosiloxanes. Adequate solubility is advantageous for keeping the nitrogen-containing superbase in intimate contact with the organosiloxane constituents of the condensation curable silicone composition during curing thereof and in intimate contact with the silicone matrix of the cured product prepared thereby. Solubility of the nitrogen-containing superbase is adequate if it is partially miscible or miscible in one or more of the organosiloxane constituents of the condensation curable silicone composition or in the silicone matrix of the cured product of curing thereof.

Alternatively or additionally to having a high de-sorption temperature, high basicity in an organic solvent such as acetonitrile, low volatility, and adequate solubility, the nitrogen-containing superbase may also have high condensation catalytic activity for catalyzing the condensation curing of the condensation curable silicone composition. Condensation catalytic activity is high if the condensation curable silicone composition cures to tan delta=1 in the time period described above.

The advantages and benefits of a nitrogen-containing superbase, used in the effective amount, that has high basicity in an organic solvent such as acetonitrile over a nitrogen-containing base that does not may be illustrated by comparing the performance of the superbase, DBU, in an inventive example with that of the non-superbase, dioctylamine (DOA) in a comparative example. The mono-protonated form of the conjugate acid of DBU has a pKa>24 (acetonitrile), whereas the mono-protonated form of the conjugate acid of DOA has pKa 18.8 (acetonitrile), and thus DBU is advantageously more than five orders of magnitude more basic than DOA in acetonitrile. The comparison may involve comparing the cure rates of different condensation curable silicone compositions wherein in one such inventive composition DBU is used, in separate amounts, as both the treating agent in the treated particles and as the condensation catalyst; while in a first comparative composition DOA is used as the treating agent in the treated particles, which have been first isolated from the DOA treatment process before being used in the first comparative composition, but DBU is used as the condensation catalyst. As shown later in the Examples 14 (Table 5), the DBU performs significantly better as the nitrogen-containing superbase to treat a phosphor when DBU is also used as a condensation catalyst in Examples 14a-14e than does DOA perform as the nitrogen-containing base to treat a phosphor when DBU is used as a condensation catalyst in the first comparative composition, as shown later in Examples 15a-15b (Table 6). That is, when DBU is used as both a phosphor treating agent and a condensation catalyst in inventive compositions, Examples 14a-14e (Table 5), it increases curing speed as measured by the respective times to tan delta=1 at 150° C. for condensation curable silicone compositions. But when DOA is used as the phosphor treating agent and DBU as the condensation catalyst in the first comparative composition, the condensation curable silicone composition did not cure.

Without wishing to be bound by a theory, it is believed that the DBU rapidly displaced the DOA from the DOA-treated phosphor particles to give in situ generated DBU-treated phosphor particles and DOA as an (inferior) condensation catalyst. An analogous result would be expected from a second comparative composition that used untreated phosphor and DBU as condensation catalyst, wherein the DBU would be expected to bond in situ to the untreated phosphor particles, thereby rendering the second comparative composition uncurable, or at least slower to cure (i.e., having a slower cure speed) than a third comparative composition that was the same as the second comparative composition except that the third comparative composition would lack (would be free of) phosphors. That is, treatment of untreated phosphors in situ in a condensation curable silicone composition that included DBU as the condensation catalyst would fail because the untreated phosphors would effectively poison the catalyst and the composition would not be curable, or at least curing would be inhibited relative to a composition without untreated phosphors. Based on the results with the high basicity amine DBU, it is also expected that other high basicity amines such as TBD, MTBD, TMG, and DBN when used as both phosphor treating agent and condensation catalyst would perform significantly better than a lower basicity amine such as dioctylamine (DOA) would perform when used as a phosphor treating agent in conjunction with the TBD, MTBD, TMG, and DBN as the condensation catalyst, in terms of increasing curing speed as measured by the same method.

The nitrogen-containing base (e.g., nitrogen-containing superbase) used to treat a particulate solid and obtain treated particles may be any one of the foregoing nitrogen-containing bases, or a combination of any two or more thereof. The nitrogen-containing bases having the structures drawn above are not limited to the conformational isomers drawn, but include any conformational isomer thereof (e.g., cis and trans isomers, boat and chair isomers, and the like).

The nitrogen-containing base (e.g., nitrogen-containing superbase) used to treat a particulate solid and obtain treated particles may be at a concentration (loading) in the treated particles of from 1 microgram (µg) to 3,000 µg of the nitrogen-containing base per gram of untreated particulate solid used to prepare the treated particles; alternatively from 5 µg to 2,000 µg nitrogen-containing base per gram of untreated particulate solid used; alternatively from 10 µg to 1,000 µg nitrogen-containing base per gram of untreated particulate solid used. The untreated particulate solid may be the untreated particulate filler, alternatively the untreated phosphor.

In some embodiments, the condensation curable silicone composition comprises treated particles comprising a particulate solid having an effective amount of nitrogen-containing base (e.g., nitrogen-containing superbase) disposed thereon. The particulate solid is capable of absorbing the nitrogen-containing base. The particulate solid may have acidic sites on its surface. The disposed nitrogen-containing base (e.g., nitrogen-containing superbase) may be bonded to said acidic sites on the surface of the particulate solid, such as via an acid-base reaction such as a hydrogen cation (proton) exchange reaction or a Lewis acid-Lewis base bonding. The particulate solid is at least one of a particulate filler and a particulate phosphor. The particulate filler is different from the particulate phosphor in at least one characteristic such as composition, the ability to function as a phosphor, particle size, loading, and the like. A "phosphor" is a type of wavelength converter that absorbs light at a first wavelength, and responsively emits light at a second wavelength that is different than the first wavelength. For example, a neodymium-doped yttrium-aluminum-garnet (Nd:YAG) phosphor, when exposed to white light, or a portion thereof other than yellow light, will responsively emit a yellow light. A particulate filler, as used herein, means any finely divided organic or inorganic solid other than a particulate phosphor. Examples of particulate fillers useful in the condensation curable silicone composition include thixotropic fillers, reinforcing fillers, conductive fillers (thermally and/or electrically conductive), pigments (not phosphors), and extending fillers. The particulate filler or particulate phosphor can be any suitable particulate filler or particulate phosphor, including a nanoparticulate filler or a nanoparticulate phosphor (e.g., nanoparticulate filler or nanoparticulate phosphor having a largest dimension or average largest dimension of from greater than 0 nm to less than about 50 nm; alternatively about 5 nm to less than about 20 nm; alternatively about 5 nm to less than about 10 nm; alternatively about 1 nm to less than about 5 nm).

The treated particles may be present in the condensation curable silicone composition in an amount (loading) ranging from about 0.1% to <100%, e.g., from about 2% to <100%, alternatively from about 1% to about 60%; alternatively from 3% to about 60%; alternatively from 5% to about 60%; alternatively from 10% to about 60%; alternatively from 15% to about 60%; alternatively from 20% to about 60%; alternatively from about 25% to about 60%; alternatively from about 30% to about 60%; alternatively from about 40% to about 60%; alternatively from about 50% to about 60%; alternatively from about 25% to about 50%; alternatively from about 25% to about 40%; alternatively from about 25% to about 30%; alternatively from about 30% to about 40%; alternatively from about 30% to about 50%; alternatively from about 40% to about 50%; based on the total weight of the condensation curable silicone composition. In some embodiments the treated particles are present in the condensation curable silicone composition in an amount effective to decrease the time necessary for the condensation curable silicone composition to cure and reach a tan delta value equal to 1 at 150° C. by at least 20 seconds, alternatively by at least 30 seconds, alternatively by at least 1 minute, alternatively by at least 10 minutes, alternatively by at least 10%, alternatively by at least 50%, alternatively by at least 60%, compared to the time necessary for a comparative condensation curable silicone composition comprising the condensation curable polyorganosiloxane and untreated particles (i.e., particles free of the nitrogen-containing base). The greater the decrease in time necessary for the condensation curable silicone composition to cure and reach a tan delta value=1, the greater the advantageous enhancement of the nitrogen-containing base (e.g., the nitrogen-containing superbase) on the cure speed of curing the condensation curable silicone composition to give the cured product.

Examples of suitable particulate/nanoparticulate fillers used to obtain treated particles comprising a particulate/nanoparticulate filler having an effective amount of nitrogen-containing base (e.g., nitrogen-containing superbase) disposed thereon include particulate/nanoparticulate fillers comprising metal oxides of aluminum, titanium, zirconium, iron, tantalum, silicon, zinc and mixed metal oxides including metal oxides comprising barium, titanium and strontium (e.g., barium and titanium and strontium and titanium). In some embodiments, suitable particulate/nanoparticulate fillers comprise at least one of $SiO_2$, $TiO_2$, $Al_2O_3$, $ZrO_2$, $BaTiO_3$, $Ta_2O_5$, $Fe_2O_3$, ZnO, and $SrTiO_3$. Suitable particulate/nanoparticulate fillers also include fumed particulate/nanoparticulate filler oxides such as fumed $Al_2O_3$. In some embodiments, the particulate/nanoparticulate fillers comprise at least one of $TiO_2$, $SiO_2$, ZnO, $ZrO_2$, and $Al_2O_3$. In other embodiments, suitable particulate/nanoparticulate fillers comprise nitrides such as AlN, $Si_3N_4$, and BN. In some embodiments the foregoing fillers are characterized as having surface hydroxyl groups, which are acidic. For example, moisture in air may react with a transition metal oxide or silicon oxide of the filler to give acidic $M^F$-OH groups, wherein $M^F$ represents the transition metal or Si of the filler having a transition metal or Si (e.g., Si, Ti, Al, Zr, Ba, Ta, Fe, Zn, or Sr).

Examples of suitable particulate/nanoparticulate phosphors used to obtain treated particles comprising a particulate/nanoparticulate phosphor having an effective amount of nitrogen-containing base (e.g., nitrogen-containing superbase) disposed thereon include particulate/nanoparticulate phosphors comprising at least one of cerium-doped phosphors, aluminate phosphors, silicate phosphors, garnet phosphors, and nitride phosphors. These types of phosphors are known in the art and are generally commercially available from, e.g., Intematix Corp., Freemont, Calif. Alternatively or additionally, the particulate/nanoparticulate phosphors may be colored wherein the color is red, orange, yellow, green, blue, indigo, or violet; alternatively the color is orange, yellow, green, blue, indigo, or violet; alternatively the color is red; alternatively the color is yellow; alternatively the color is green; alternatively the color is blue; alternatively the color is indigo; alternatively the color is violet; alternatively the color is cyan. In some embodiments the foregoing phosphors are characterized as having surface hydroxyl groups, which are acidic. For example, moisture in air may react with a transition metal oxide of an ad rem phosphor to give acidic $M^P$-OH groups, wherein $M^P$ represents the transition metal of the phosphor (e.g., Ce, Y, Al, Zn, Cd, Ag, Cu, Eu, Mg, Mn, Fe, Co, As, Gd, Tb, Ga, In, B, Pb, W, Sr, La, Ge, Sn, Sb, or Tl).

Examples of suitable particulate/nanoparticulate phosphors comprise at least one of Ce:YAG; $Zn_2SiO_4$:Mn (Willemite); ZnS:Ag+(Zn,Cd)S:Ag; ZnS:Ag+ZnS:Cu+$Y_2O_2$S: Eu; ZnO:Zn; KCl; ZnS:Ag,Cl or ZnS:Zn; $(KF,MgF_2)$:Mn; (Zn,Cd)S:Ag or (Zn,Cd)S:Cu; $Y_2O_2$S:Eu+$Fe_2O_3$, ZnS:Cu, Al; ZnS:Ag+Co-on-$Al_2O_3$;$(KF,MgF_2)$:Mn; (Zn,Cd)S:Cu, Cl; ZnS:Cu or ZnS:Cu,Ag; $MgF_2$:Mn; $(Zn,Mg)F_2$:Mn; $Zn_2SiO_4$:Mn,As; ZnS:Ag+(Zn,Cd)S:Cu; $Gd_2O_2$S:Tb; $Y_2O_2$S:Tb; $Y_3Al_5O_{12}$:Ce; $Y_2SiO_5$:Ce; $Y_3Al_5O_{12}$:Tb; ZnS: Ag,Al; ZnS:Ag; ZnS:Cu,Al or ZnS:Cu,Au,Al; (Zn,Cd)S:Cu, Cl+(Zn,Cd)S:Ag,Cl; $Y_2SiO_5$:Tb; $Y_2OS$:Tb; $Y_3(Al,Ga)_5O_{12}$: Ce; $Y_3(Al,Ga)_5O_{12}$:Tb; $InBO_3$:Tb; $InBO_3$:Eu; $InBO_3$:Tb+ $InBO_3$:Eu; $InBO_3$:Tb+$InBO_3$:Eu+ZnS:Ag; (Ba,Eu) $Mg_2Al_{16}O_{27}$; $(Ce,Tb)MgAl_{11}O_{19}$; $BaMgAl_{10}O_{17}$:Eu,Mn; $BaMg_2Al_{16}O_{27}$:Eu(II); $BaMgAl_{10}O_{17}$:Eu,Mn; $BaMg_2Al_{16}O_{27}$:Eu(II),Mn(II); $Ce_{0.67}Tb_{0.33}MgAl_{11}O_{19}$:Ce, Tb; $Zn_2SiO_4$:Mn,$Sb_2O_3$; $CaSiO_3$:Pb,Mn; $CaWO_4$ (Scheelite); $CaWO_4$:Pb; $MgWO_4$; $(Sr,Eu,Ba,Ca)_5(PO_4)_3Cl$; $Sr_5Cl$ $(PO_4)_3$:Eu(II); $(Ca,Sr,Ba)_3(PO_4)_2Cl_2$:Eu; $(Sr,Ca,Ba)_{10}$ $(PO_4)_6Cl_2$:Eu; $Sr_2P_2O_7$:Sn(II); $Sr_6P_5BO_{20}$:Eu; $Ca_5F(PO_4)_3$: Sb; $(Ba,Ti)_2P_2O_7$:Ti; $3Sr_3(PO_4)_2.SrF_2$:Sb,Mn; $Sr_5F(PO_4)_3$: Sb,Mn; $Sr_5F(PO_4)_3$:Sb,Mn; $LaPO_4$:Ce,Tb; $(La,Ce,Tb)PO_4$; $(La,Ce,Tb)PO_4$:Ce,Tb; $Ca_3(PO_4)_2.CaF_2$:Ce,Mn; (Ca,Zn, Mg)$_3$ $(PO_4)_2$:Sn; $(Zn,Sr)_3(PO_4)_2$:Mn; $(Sr,Mg)_3(PO_4)_2$:Sn;

$(Sr,Mg)_3(PO_4)_2:Sn(II)$; $Ca_5F(PO_4)_3:Sb,Mn$; $Ca_5(F,Cl)(PO_4)_3:Sb,Mn$; $(Y,Eu)_2O_3$; $Y_2O_3:Eu(III)$; $Mg_4(F)GeO_6:Mn$; $Mg_4(F)(Ge,Sn)O_6:Mn$; $Y(P,V)O_4:Eu$; $YVO_4:Eu$; $Y_2O_2S:Eu$; 3.5 $MgO.0.5$ $MgF_2.GeO_2:Mn$; $Mg_5As_2O_{11}:Mn$; $SrAl_2O_7:Pb$; $LaMgAl_{11}O_{19}:Ce$; $LaPO_4:Ce$; $SrAl_{12}O_{19}:Ce$; $BaSi_2O_5:Pb$; $SrFB_2O_3:Eu(II)$; $SrB_4O_7:Eu$; $Sr_2MgSi_2O_7:Pb$; $MgGa_2O_4:Mn(II)$; $Gd_2O_2S:Tb$; $Gd_2O_2S:Eu$; $Gd_2O_2S:Pr$; $Gd_2O_2S:Pr,Ce,F$; $Y_2O_2S:Tb$; $Y_2O_2S:Eu$; $Y_2O_2S:Pr$; $Zn(0.5)Cd(0.4)S:Ag$; $Zn(0.4)Cd(0.6)S:Ag$; $CdWO_4$; $CaWO_4$; $MgWO_4$; $Y_2SiO_5:Ce$;$YAlO_3:Ce$; $Y_3Al_5O_{12}:Ce$; $Y_3(Al,Ga)_5O_{12}:Ce$; $CdS:In$; $ZnO:Ga$; $ZnO:Zn$; $(Zn,Cd)S:Cu,Al$; $ZnS:Cu,Al,Au$; $ZnCdS:Ag,Cu$; $ZnS:Ag$; anthracene, EJ-212, $Zn_2SiO_4:Mn$; $ZnS:Cu$; $NaI:TI$; $CsI:Tl$; $LiF/ZnS:Ag$; $LiF/ZnSCu,Al,Au$; and nitrides such as, $LaAl(Si_6Al_3)N_7O_3:Ce^{3+}$; $Ca_{0.898}Ce_{0.068}$ $SigAl_3ON_{15}$; $La_{4.9}Ce_{0.1}Si_3O_{12}N$; $La_{0.96}Ce_{0.04}SiO_2N$; $La_{2.82}Ce_{0.18}Si_8O_4N_{11}$; $(Ca,Sr,Ba)Si_2O_2N_2:Eu^{2+}$; $(Sr,Ba)YSi_4N_7:Eu^{2+}$; $(Ca,Sr,Ba)_2Si_5N_8:Eu^{2+}$; $(Sr,Ca)AlSiN_3:Eu^{2+}$, and the like. In some embodiments the foregoing phosphors are characterized by surface hydroxyl groups such as acidic $M^P$-OH groups, wherein M represents the ad rem transition metal thereof. For example, in the phosphor Ce:YAG, YAG is yttrium aluminum garnet ($Y_3Al_5O_{12}$) and $M^P$ may be cerium (Ce), yttrium (Y), or aluminum (Al).

In some embodiments, the condensation curable silicone composition further comprises a condensation catalyst. In some embodiments the condensation catalyst may be selected from any catalyst known in the art to effect condensation cure of condensation curable organic compositions. In some embodiments the condensation catalyst may be selected from any catalyst known in the art to effect condensation cure of organosiloxanes. Condensation catalyst can be any chemical entity or molecule that may be used to promote a condensation reaction of silicon bonded hydroxy (silanol) groups to form Si—O—Si linkages (and by-product water molecules) to give a condensation cured product.

Examples of suitable condensation catalysts include the nitrogen-containing bases (e.g., nitrogen-containing superbases) described herein and complexes of lead, tin, titanium, zinc, and iron, such as various tin or titanium catalysts. Other examples include other basic compounds, such as trimethylbenzylammonium hydroxide, tetramethylammonium hydroxide and metal-containing compounds such as tetraisopropyl titanate, tetrabutyl titanate, titanium acetylacetonate, aluminum triisobutoxide, aluminum triisopropoxide, zirconium tetra(acetylacetonato), zirconium tetrabutylate, cobalt octylate, cobalt acetylacetonato, iron acetylacetonato, tin acetylacetonato, dibutyltin octylate, dibutyltin laurate, zinc octylate, zinc bezoate, zinc p-tert-butylbenzoate, zinc laurate, zinc stearate, aluminum phosphate, and aluminum triisopropoxide; organic aluminum chelates such as aluminum trisacetylacetonate andaluminum bisethylacetoacetate monoacetylacetonate; and organic titanium chelates such as diisopropoxybis(ethylacetoacetate) titanium, and diisopropoxybis(ethylacetoacetate)titanium.

In some embodiments, the condensation catalysts include zinc octylate, zinc benzoate, zinc p-tert-butylbenzoate, zinc laurate, zinc stearate, aluminum phosphate, and aluminum triisopropoxide. See, e.g., U.S. Pat. No. 8,193,269, the entire disclosure of which is incorporated by reference as if fully set forth herein. Other examples of condensation catalysts include, but are not limited to aluminum alkoxides, antimony alkoxides, barium alkoxides, boron alkoxides, calcium alkoxides, cerium alkoxides, erbium alkoxides, gallium alkoxides, silicon alkoxides, germanium alkoxides, hafnium alkoxides, indium alkoxides, iron alkoxides, lanthanum alkoxides, magnesium alkoxides, neodymium alkoxides, samarium alkoxides, strontium alkoxides, tantalum alkoxides, titanium alkoxides, tin alkoxides, vanadium alkoxide oxides, yttrium alkoxides, zinc alkoxides, zirconium alkoxides, titanium or zirconium compounds, especially titanium and zirconium alkoxides, and chelates and oligocondensates and polycondensates of the above alkoxides, dialkyltin diacetate, tin(II) octoate, dialkyltin diacylate, dialkyltin oxide and double metal alkoxides. Double metal alkoxides are alkoxides containing two different metals in a particular ratio. In some embodiments, the condensation catalysts include titanium tetraethylate, titanium tetrapropylate, titanium tetraisopropylate, titanium tetrabutylate, titanium tetraisooctylate, titanium isopropylate tristearoylate, titanium truisopropylate stearoylate, titanium diisopropylate distearoylate, zirconium tetrapropylate, zirconium tetraisopropylate, zirconium tetrabutylate. See, e.g., U.S. Pat. No. 7,005,460, the entire disclosure of which is incorporated by reference as if fully set forth herein. In addition, the condensation catalysts include titanates, zirconates and hafnates as described in DE 4427528 C2 and EP 0 639 622 B1, both of which are incorporated by reference as if fully set forth herein.

In some embodiments the condensation catalyst is independently the nitrogen-containing base (e.g., nitrogen-containing superbase). In some embodiments, the nitrogen-containing base and the condensation catalyst are the same nitrogen-containing base (e.g., nitrogen-containing superbase) compound (e.g., both the condensation catalyst and the nitrogen-containing base used to treat the particulate solid and prepare the treated particles are DBU). In other embodiments condensation catalyst and the nitrogen-containing base used to treat the particulate solid and prepare the treated particles are different nitrogen-containing base (e.g., nitrogen-containing superbase) compounds (e.g., the condensation catalyst is DBU and the nitrogen-containing base used to treat the particulate solid and prepare the treated particles is DBN, or the condensation catalyst is DBN and the nitrogen-containing base used to treat the particulate solid and prepare the treated particles is DBU. In some embodiments, the nitrogen-containing bases (e.g., nitrogen-containing superbases) and the condensation catalyst are the same compound (e.g., each is DBU). When the condensation catalyst is an embodiment of the nitrogen-containing base (e.g., nitrogen-containing superbase), the condensation curable silicone composition independently contains a first quantity of said condensation catalyst and a second quantity of the nitrogen-containing base (e.g., nitrogen-containing superbase) used to treat the particulate solid. The first quantity of said condensation catalyst is sufficient to catalyze condensation curing of the composition and the second quantity of the nitrogen-containing base (e.g., nitrogen-containing superbase) used to treat the particulate solid is sufficient to treat the particulate solid, e.g., such that upon curing the composition the time to tan delta=1 is reduced.

The amount of condensation catalyst in the condensation curable silicone composition may vary and is not limiting. In some embodiments, the amount of condensation catalyst is a catalytically effective amount for promoting (enhancing) a condensation reaction or curing of the condensation curable silicone composition. The catalytically effective amount may vary depending on, among other factors, the condensation catalyst selected; and the concentration of residual silanol groups, if any, in the condensation curable silicone composition. Generally speaking, the catalytically effective amount of condensation catalyst is an amount sufficient so that the time necessary for the condensation curable silicone composition to cure and reach a tan delta value equal to 1 is from about 30 seconds to about 1 hour (e.g., alternatively from about 1 minute to about 30 minutes; alternatively about 5 minutes to about 30 minutes; alternatively about 2 minutes to about 30 minutes; alternatively about 10 minutes to about 45 minutes; alternatively about 15 minutes to about 1 hour) at 150° C. Further the catalytically effective amount is such that the total amount of the nitrogen-containing base (e.g., nitrogen-containing superbase) disposed on the particulate solid of the treated particles plus any catalytically effective amount of a condensation catalyst (e.g., a same or different nitrogen-containing superbase; disposed in the condensation curable silicone composition but not on the particulate solid) is such that the time necessary for the condensation curable silicone composition to cure and reach a tan delta value=1 is at least 30 seconds, but not so much that the time is greater than 65 minutes at 150° C., alternatively at 140° C., alternatively at 130° C., alternatively at 120° C.

In some embodiments, the time necessary for condensation curable silicone composition lacking treated particles relative to the time necessary for the condensation curable silicone composition comprising treated particles will be within 1 hour from each other, alternatively within 30 minutes from each other, alternatively within 15 minutes from each other, alternatively will be substantially the same at 150° C.

In some embodiments, the amount of condensation catalyst present in the condensation curable silicone composition is described in parts per million (ppm). The amount of condensation catalyst added to the condensation curable silicone composition may range from about 0.1 to about 1,000 ppm (e.g., alternatively from about 1 to about 500 ppm, alternatively about 10 to about 100 ppm, alternatively about 10 to about 50 ppm, alternatively about 5 to about 30 ppm, alternatively about 5 to 25 ppm) by weight of the condensation curable silicone composition. In some embodiments, the condensation catalyst may be diluted in an organic solvent before being added to the condensation curable polyorganosiloxane and the treated particles to give embodiments of the condensation curable silicone composition that further comprise the condensation catalyst and the organic solvent. Optionally the organic solvent may be removed from the condensation curable silicone composition before curing the composition. The removal may be by any suitable means such as evaporation and/or stripping.

Any organic solvent is suitable, including a ($C_6$-$C_{10}$) hydrocarbon, a ($C_1$-$C_5$)alcohol, or a combination of any two or more thereof. In some embodiments the organic solvent is the ($C_6$-$C_{10}$)hydrocarbon; alternatively the organic solvent is toluene or heptane. In some embodiments the organic solvent is the ($C_1$-$C_5$)alcohol, alternatively the organic solvent is methanol, ethanol, propanol (i.e., $CH_3CH_2CH_2OH$), 1-methylethanol (aka 2-propanol or isopropyl alcohol), or butanol. In other embodiments the organic solvent is an ether, a carboxylic ester, a ketone, an organonitrile, or a combination of any two or more thereof. In some embodiments the organic solvent is the ether, which is tetrahydrofuran or 1,4-dioxane; alternatively the organic solvent is the ester, which is ethyl acetate, propyl acetate, or ethyl propionate; alternatively the organic solvent is the ketone, which is acetone or methyl ethyl ketone; alternatively the organic solvent is the organonitrile, which is acetonitrile or propionitrile. In some embodiments the organic solvent is toluene, heptane, propanol, or 1-methylethanol; alternatively heptane or propanol; alternatively toluene or 1-methylethanol; alternatively heptane; alternatively propanol; alternatively toluene; alternatively 1-methylethanol.

In some embodiments, the condensation curable silicone composition further comprises a diluent. In some embodiments, the diluent is an organic solvent. When the diluent is an organic solvent, it can be any suitable organic solvent as described above, including the ($C_6$-$C_{10}$)hydrocarbon, ($C_1$-$C_5$)alcohol, or combination of any two or more thereof, such as toluene, heptane, propanol or 1-methylethanol. Alternatively, the organic solvent is the ether, carboxylic ester, ketone, organonitrile, or combination of any two or more thereof. Embodiments of the present invention also include water-borne emulsions and suspensions comprising the condensation curable silicone composition and the treated particles.

In some embodiments, the cured product of curing the condensation curable silicone composition comprises an organosiloxane block copolymer. In some embodiments the organosiloxane block copolymer comprises: 0 to 10 mole percent M constituent units of the formula $[R^1_3SiO_{1/2}]$, 40 to 90 mole percent D constituent units of the formula $[R^1_2SiO_{2/2}]$, 10 to 60 mole percent T constituent units of the formula $[R^1SiO_{3/2}]$, and 0.5 to 35 mole percent silicon bonded hydroxy (SiOH) wherein: the sum of the mole percent M, D, and T constituent units is 100 mole percent; each $R^1$ is independently a $C_1$ to $C_{30}$ hydrocarbyl group; the D constituent units $[R^1_2SiO_{2/2}]$ are arranged in linear blocks having an average of from 50 to 300 D constituent units $[R^1_2SiO_{2/2}]$ per linear block; the T constituent units $[R^1SiO_{3/2}]$ are arranged in non-linear blocks having a block weight of at least 500 g/mole; the M constituent units $[R^1_3SiO_{1/2}]$ are connected to T units; at least 30% of the non-linear blocks are crosslinked with each other; each linear block is linked to at least one non-linear block via —Si—O—Si— linkages; and the organosiloxane block copolymer has a weight average molecular weight of at least 20,000 g/mole. Such organosiloxane block copolymers have been described in at least US2013/0168727; US2013/0171354 (now U.S. Pat. No. 8,921,493); US2013/0245187 (now U.S. Pat. No. 8,957,147); and US2013/0165602 (now U.S. Pat. No. 8,921,494), all of which are incorporated by reference as if fully set forth herein.

As used herein, the term "$C_1$ to $C_{30}$ hydrocarbyl group" or, simply, "($C_1$-$C_{30}$)hydrocarbyl" refers to a univalent functional group derived from a straight chain or branched chain hydrocarbon comprising from 1 to 30 carbon atoms or derived from a cyclic hydrocarbon comprising 3 to 30 carbon atoms (or 6 to 30 carbon atoms for aryl), and can be alkyl, cycloalkyl, aryl or any combination thereof.

The condensation curable silicone composition may be cured to give a cured product. Cured products from condensation curing the condensation curable silicone composition are included herein. The condensation curable silicone composition may be cured in the presence of the condensation catalysts described herein, under condensation cure conditions known in the art, to give solid cured compositions. See, e.g., US2013/0168727; US2013/0171354 (now U.S. Pat. No. 8,921,493); US2013/0245187 (now U.S. Pat. No. 8,957,147); and US2013/0165602 (now U.S. Pat. No. 8,921,494), all of which are incorporated by reference as if fully set forth herein. Condensation cure conditions include, for example, heating the condensation curable silicone composition at a temperature of from 50° to 250° C., alternatively from 100° to 250° C., alternatively from 120° to 180° C. The heating may be performed for a period of time sufficient to effect curing such as for 10 minutes to 10 hours, where, all other things being equal, the higher the temperature the shorter the period of time, and the lower the temperature the longer the period of time. As described later, the condensation curable silicone composition may be formed as a treated particle-containing film, and then cured by placing the treated particle-containing film in a controlled temperature furnace/oven at temperatures from 100° to 250° C. for 10 minutes to 10 hours (e.g., from 120° to 180° C. for 3 hours).

In some embodiments, such as those wherein the cured product comprises the organosiloxane block copolymer, the cured product from condensation curing the condensation curable silicone composition has a Young's modulus of about 20 megapascals (MPa) to about 500 MPa, e.g., alternatively from about 20 MPa to about 200 MPa, alternatively from about 20 MPa to about 150 MPa, alternatively about 40 MPa to about 150 MPa, alternatively about 50 MPa to about 120 MPa, alternatively about 40 MPa to about 100 MPa, alternatively about 80 MPa to about 120 MPa, alternatively about 50 MPa to about 150 MPa. The foregoing Young's modulus may be referred to herein as Young's modulus before thermal aging. All Young's modulus values are determined with 1 mm thick sample films of test material, cut to dog-bone shaped specimens, followed by tensile measurement using an Instron Bluehill instrument.

In some embodiments, such as those wherein the cured product comprises the organosiloxane block copolymer, the cured product from condensation curing the condensation curable silicone composition is subjected to thermal aging at 225° C. for 48 hours, and the thermally aged product has a Young's modulus of about 20 MPa to about 500 MPa, e.g., alternatively from about 50 MPa to about 500 MPa, alternatively about 50 MPa to about 400 MPa, alternatively about 50 MPa to about 350 MPa, alternatively about 100 MPa to about 350 MPa, alternatively about 150 MPa to about 300 MPa, alternatively about 100 MPa to about 250 MPa. The foregoing Young's modulus may be referred to herein as Young's modulus after thermal aging.

In some embodiments, such as those wherein the cured product comprises the organosiloxane block copolymer, the cured product from condensation curing the condensation curable silicone composition has a ratio of the Young's modulus of the cured product after thermal aging at 225° C. for 48 hours versus the Young's modulus of the cured product before thermal aging at 225° C. for 48 hours of from greater than 0 to less than 4. In some embodiments the maximum ratio may be, e.g., alternatively less than 3.5, alternatively less than 3, alternatively less than 2.5, alternatively less than 2, alternatively less than 1.5, alternatively less than 1.0, alternatively less than 0.5. In some embodiments, the cured product of the condensation curable composition has a ratio of the Young's modulus of the cured product after thermal aging at 225° C. for 48 hours versus the Young's modulus of the cured product before thermal aging at 225° C. for 48 hours of about 1:1 to about 4:1, alternatively about 1:1 to about 3:1, alternatively about 1:1 to about 2:1, alternatively about 1:1.

Before the present invention was made, we were concerned that treating phosphors with too much nitrogen-containing base (e.g., nitrogen-containing superbase) might result in some base remaining around at high temperature, possibly degrading the cured product. Beneficially, the aforementioned ratio of Young's modulus values before and after thermal aging discloses embodiments, such as those wherein the cured product comprises the organosiloxane block copolymer, where beneficially such degradation does not happen. Further, some condensation catalysts used with an untreated phosphor in a comparative curable composition may degrade the comparative composition or resulting comparative cured product. This ratio of Young's modulus values also describes an improvement in thermal stability of the inventive cured product obtained with a condensation catalyst and treated phosphors compared to thermal stability of a comparative cured product. This thermal stability improvement is due to the phosphor treatment with the nitrogen-containing base, especially the nitrogen-containing superbase.

In some embodiments, the cured product from condensation curing the condensation curable silicone composition has an elongation at break of about 20% to about 300%, e.g., alternatively from about 20% to about 250%, alternatively about 20% to about 200%, alternatively about 20% to about 150%, alternatively about 50% to about 200%, alternatively about 100% to about 200%, alternatively about 50% to about 150%, alternatively about 80% to about 160%. The foregoing elongation at break may be referred to herein as elongation at break before thermal aging. All elongation at break values are determined using 1 mm thick sample films cut to dog-bone shaped specimens, followed by tensile measurement using an Instron Bluehill instrument.

In some embodiments, the cured product from condensation curing the condensation curable silicone composition is subjected to thermal aging at 225° C. for 48 hours, and the thermally aged product has an elongation at break of about 1% to about 200%, e.g., alternatively from about 2% to about 150%, alternatively from about 4% to about 100%, alternatively from about 4% to about 75%, alternatively from about 4% to about 50%, alternatively about 10% to about 60%, alternatively about 10% to about 75%, alternatively about 15% to about 50%, alternatively about 15% to about 60%. The foregoing elongation at break may be referred to herein as elongation at break after thermal aging.

Before this invention we were concerned about thermal instability of silicone cured products containing phosphors. Beneficially, the aforementioned elongation-at-break values before and after thermal aging discloses embodiments, such as those wherein the cured product comprises the organosiloxane block copolymer, where beneficially such thermal instability does not happen. The elongation-at-break values show that the cured product has good thermal stability, which without being bound by theory may be attributable to the present nitrogen-containing base, especially the nitrogen-containing superbase, treatment of the phosphors.

In some embodiments, the cured product from condensation curing the condensation curable silicone composition has a Commission Internationale de l'Eclairage (CIE) b* value after thermal aging for 72 hours at 225° C. that is from 0 to about 7, e.g., alternatively no more than about 6, alternatively no more than about 4, alternatively no more than about 3, alternatively no more than about 2, alternatively no more than about 1, alternatively from about 1 to about 7, alternatively from about 1 to about 4, alternatively from about 2 to about 6, alternatively from about 1 to about 3, alternatively from about 2 to about 5. All CIE b* values are measured using 1 mm thick film of each sample cut as 2.54 cm×2.54 cm specimens, followed by thermal aging the specimens at 225° C. for 72 hours, and then measuring b* values using the BYK colorimeter, a BYK Spectro-Guide instrument.

In some embodiments, the cured product from condensation curing the condensation curable silicone composition can form coatings and films having an optical transmittance of visible light greater than 95% to 100%, even when the films are as thick as a thickness of 1 millimeters (mm). In some embodiments, coatings and films derived from the cured product from condensation curing the condensation curable silicone composition can have an optical transmittance of light having a wavelength from about 350 nanometers (nm) to about 1000 nm of at least 95% to 100%, e.g., alternatively at least 96%; alternatively at least 97%; alternatively at least 98%; alternatively at least 99%; alternatively 100% transmittance of visible light, even when the films reach a thickness of from about 50 μm to about 500 μm or greater (e.g., 1 mm).

In some embodiments, the cured product from condensation curing the condensation curable silicone composition can have a combination of any two or more, alternatively all, of the foregoing characteristics selected from: Young's modulus before thermal aging; Young's modulus after thermal aging; ratio of Young's modulus after thermal aging versus (to) the Young's modulus before thermal aging; elongation at break before thermal aging; elongation at break after thermal aging; (CIE) b* value after thermal aging; and optical transmittance of visible light. Each such characteristic may have any one of its foregoing ranges or values.

The thermal aging conditions such as temperature and period of time described herein (225° C. for 72 hours) are, in some embodiments, different than the curing conditions such as temperature and period of time. In some embodiments, curing conditions include heating a condensation curable silicone composition at 120° C. for 1 hour and subsequently at 160° C. for 3 hours. In other embodiments the thermal aging conditions are the same as the curing conditions.

The various embodiments of the present invention also relate to methods for preparing the cured product, also referred to herein as a cured polyorganosiloxane, the method comprising: condensation curing the condensation curable silicone composition, also referred to herein as a condensation curable polyorganosiloxane, in the presence of a condensation catalyst and treated particles having an effective amount of nitrogen-containing base (e.g., nitrogen-containing superbase) disposed thereon; wherein the effective amount of nitrogen-containing base (e.g., nitrogen-containing superbase) disposed on the treated particles is sufficient to neutralize a substantial number of a plurality of acidic sites on untreated particles; to give a cured product (a cured polyorganosiloxane).

The various embodiments of the present invention also relate to methods for preparing a cured polyorganosiloxane, the method comprising: condensation curing a condensation curable polyorganosiloxane in the presence of a condensation catalyst and treated particles comprising a particulate solid having an effective amount of nitrogen-containing base (e.g., nitrogen-containing superbase) disposed thereon; wherein the effective amount of nitrogen-containing base (e.g., nitrogen-containing superbase) disposed on the particulate solid is sufficient to neutralize a substantial number of a plurality of acidic sites on the particulate solid; to give a cured polyorganosiloxane.

The various embodiments of the present invention also relate to a method for treating a particulate solid having a plurality of acidic sites, the method comprising: contacting the particulate solid with a nitrogen-containing base (e.g., nitrogen-containing superbase) to give treated particles having an effective amount of nitrogen-containing base (e.g., nitrogen-containing superbase) disposed thereon, wherein the effective amount of nitrogen-containing base (e.g., nitrogen-containing superbase) is disposed on the particulate solid and is sufficient to neutralize a substantial number of a plurality of acidic sites on the particulate solid; and isolating the treated particles having an effective amount of nitrogen-containing base (e.g., nitrogen-containing superbase) disposed thereon. In some embodiments the contacting comprises contacting the particulate solid with neat nitrogen-containing base (e.g., the nitrogen-containing superbase) in liquid or vapor form, alternatively in liquid form, alternatively in vapor form. In some embodiments the contacting comprises contacting the particulate solid with a composition comprising a nitrogen-containing base (e.g., nitrogen-containing superbase) and a solvent, such as the organic solvent as described above, such as the ($C_6$-$C_{10}$) hydrocarbon, ($C_1$-$C_5$)alcohol, or combination of any two or more thereof, such as toluene, heptane, propanol or 1-methylethanol. Alternatively, the organic solvent is the ether, carboxylic ester, ketone, organonitrile, or combination of any two or more thereof. Optionally, the solvent may be removed from the treated particles.

In some embodiments the isolated treated particles are used "as is" in the condensation curable silicone composition and related methods and cured products. "As is" means as isolated or without further processing to remove excess nitrogen-containing base (e.g., nitrogen-containing superbase). Any nitrogen-containing superbase in excess of an amount desired for treating the particulate solid may advantageously function as a condensation catalyst in the condensation curable silicone composition.

In some embodiments it may be desirable to control how much nitrogen-containing base (e.g., nitrogen-containing superbase) the treated particles contain. Too much excess nitrogen-containing base (e.g., nitrogen-containing superbase) in the treated particles might elute into the other constituents of the condensation curable silicone composition and trigger decomposition or premature curing thereof. In some embodiments it is desirable to avoid premature curing of the condensation curable silicone composition before the composition has been able to flow or be formed into a shape (e.g., into a film or other desired shape). The decomposition and premature curing may be avoided by further processing the isolated treated particles to remove some, but not all, of the nitrogen-containing base (e.g., nitrogen-containing superbase) therefrom before contacting the treated particles (isolated and further processed) with the other constituents of the condensation curable silicone composition, such that the treated particles after said further processing (i.e., processed and isolated treated particles) are substantially neutralized or neutralized. In some embodiments the further processing yields treated particles that are substantially pH neutral or fully pH neutral in that all their acidic sites have been neutralized with the nitrogen-containing base (e.g., nitrogen-containing superbase), but there is no excess nitrogen-containing base (e.g., nitrogen-containing superbase) left in the treated particles. In some embodiments the treated particles are the neutral treated particles and the condensation curable silicone composition, and cured product obtained by condensation curing same, contains only the neutral treated particles. In such embodiments it is possible to add a known amount of condensation catalyst to the other constituents of the condensation curable silicone composition to obtain an embodiment of the condensation curable silicone composition containing a known concentration of the condensation catalyst. This control of the concentration of the condensation catalyst in the condensation curable silicone composition may be advantageous for formulating the composition to have a controlled cure speed and/or storage shelf-life. This advantage is obtained even when the added condensation catalyst and the nitrogen-containing superbase are the same compound.

In some embodiments, the method further comprises processing (e.g., at least one of heating, exposing to vacuum, and blotting) the isolated treated particles having an effective amount of nitrogen-containing base (e.g., nitrogen-containing superbase) disposed thereon to remove therefrom a portion, but not all, of disposed nitrogen-containing base (e.g., nitrogen-containing superbase) to give processed treated particles. The processing comprises removing therefrom the portion, but not all, of disposed nitrogen-containing base (e.g., nitrogen-containing superbase) such that the time necessary for a condensation curable silicone composition comprising the processed treated particles having an effective amount of nitrogen-containing base (e.g., nitrogen-containing superbase) disposed thereon to cure and reach a tan delta value equal to 1 is from about 30 seconds to about 1 hour at 150° C. The processing may comprise removing enough, but not all, of the disposed nitrogen-containing base (e.g., nitrogen-containing superbase) such that the treated particles (e.g., treated phosphor particles) have been further processed to remove some, but not all, of the superbase therefrom to give processed treated particles (e.g., processed treated phosphor particles) that contain some superbase disposed thereon do not contain a monolithic coating or film of the superbase on the surface of the particles. The processing may be performed using any suitable technique for removing the portion, but not all, of the disposed nitrogen-containing base (e.g., nitrogen-containing superbase) from the isolated treated particles to give processed treated particles. Examples of suitable techniques are evaporating, freeze-drying, blotting with an absorbent material, and a combination of any two or more of said techniques.

In some embodiments, the processing comprises heating the isolated treated particles having an effective amount of nitrogen-containing base (e.g., nitrogen-containing superbase) disposed thereon at a temperature and for a time sufficient to remove therefrom the portion, but not all, of disposed nitrogen-containing base (e.g., nitrogen-containing superbase) to give processed treated particles such that the time necessary for a condensation curable silicone composition comprising the processed treated particles having an effective amount of nitrogen-containing base (e.g., nitrogen-containing superbase) disposed thereon to cure and reach a tan delta value equal to 1 is from about 30 seconds to about 1 hour at 150° C.

Other methods for removing a portion, but not all, of disposed nitrogen-containing base (e.g., nitrogen-containing superbase) are included herein. For example, the processing can comprise exposing the isolated treated particles to reduced pressure (e.g., vacuum) for a time sufficient to remove therefrom the portion, but not all, of disposed nitrogen-containing base (e.g., nitrogen-containing superbase) to give processed treated particles such that the time necessary for a condensation curable silicone composition comprising the processed treated particles having an effective amount of nitrogen-containing base (e.g., nitrogen-containing superbase) disposed thereon to cure and reach a tan delta value equal to 1 is from about 30 seconds to about 1 hour at 150° C. Exposing the isolated treated particles to reduced pressure (e.g., vacuum) can be used by itself or in addition to heating at a temperature and for a time sufficient to remove therefrom the portion, but not all, of disposed nitrogen-containing base (e.g., nitrogen-containing superbase) to give processed treated particles such that the time necessary for a condensation curable silicone composition comprising the processed treated particles having an effective amount of nitrogen-containing base (e.g., nitrogen-containing superbase) disposed thereon to cure and reach a tan delta value equal to 1 is from about 30 seconds to about 1 hour at 150° C. Alternatively in some embodiments, the processing can comprise subjecting the isolated treated particles to freeze-drying.

The various embodiments of the present invention also relate to a method for treating a curable polyorganosiloxane particle-containing composition, the method comprising: treating a composition comprising the condensation curable polyorganosiloxane and untreated particles with a solution comprising a solvent and a nitrogen-containing base (e.g., nitrogen-containing superbase) in an effective amount sufficient to neutralize a substantial number of a plurality of acidic sites on the untreated particles; wherein the solution comprising the nitrogen-containing base (e.g., nitrogen-containing superbase) does not substantially dissolve the condensation curable polyorganosiloxane. In some embodiments, the method for treating a curable polyorganosiloxane particle-containing composition further comprises curing the curable polyorganosiloxane particle-containing composition in the presence of a condensation catalyst. The solvent may be a volatile silicone fluid or an organic solvent. In some embodiments the solvent is the organic solvent as described above, such as the $(C_6-C_{10})$hydrocarbon, $(C_1-C_5)$ alcohol, or combination of any two or more thereof, such as toluene, heptane, propanol or 1-methylethanol. Alternatively, the organic solvent is the ether, carboxylic ester, ketone, organonitrile, or combination of any two or more thereof.

The various embodiments of the present invention also relate to a method for treating a curable polyorganosiloxane particle-containing composition, the method comprising: treating a composition comprising the condensation curable polyorganosiloxane and a particulate solid with a solution comprising a solvent and a nitrogen-containing base (e.g., nitrogen-containing superbase) in an effective amount sufficient to neutralize a substantial number of a plurality of acidic sites on the particulate solid (this gives treated particles in situ); wherein the solution comprising the nitrogen-containing base (e.g., nitrogen-containing superbase) does not substantially dissolve the condensation curable polyorganosiloxane. In such embodiments additional nitrogen-containing base (e.g., nitrogen-containing superbase) is added to give the condensation curable silicone composition. In some embodiments, the method for treating a curable polyorganosiloxane particle-containing composition further comprises curing the curable polyorganosiloxane particle-containing composition in the presence of a condensation catalyst, the additional nitrogen-containing base (e.g., nitrogen-containing superbase). The solvent may be the organic solvent as described above, such as toluene or 1-methylethanol.

In some embodiments, curable polyorganosiloxane particle-containing compositions can be disposed or applied in the form of coatings or films, which can be formed by methods generally known in the art. For example, a film or coating may be formed by combining a condensation curable polyorganosiloxane with a treated particulate solid in the presence of a diluents (e.g., a solvent such as an organic solvent such as described above such as toluene or 1-methylethanol), disposing the resulting mixture on a substrate, and removing the diluent to give a composition (e.g., a coating or a film) comprising the condensation curable polyorganosiloxane and treated particulate solid on the substrate. The coating or film may be cured on the substrate, alternatively the coating or film may be removed from the substrate before curing the coating or film. In some embodiments the coating or film may be removed from the substrate before curing the coating or film such that the removed the coating or film may be a free-standing coating or film. After curing, the resulting cured product in the form of a coating or film may be removed from the substrate to give a free-standing cured coating or film.

In some embodiments, a solution comprising the nitrogen-containing base (e.g., nitrogen-containing superbase) that does not substantially dissolve the condensation curable polyorganosiloxane can be an aqueous solution comprising the nitrogen-containing base (e.g., nitrogen-containing superbase) and water as the solvent or a substantially aqueous solution comprising the nitrogen-containing base (e.g., nitrogen-containing superbase) and a solvent comprising water and a water miscible solvent that is not water (e.g., water miscible organic solvent, miscible at 25° C.). The water miscible solvent may be an organic solvent such as acetonitrile, methanol, ethanol, tetrahydrofuran, propanol, 1-methylethanol and the like. Alternatively, the solvent may be partially water miscible. In some embodiments, the condensation curable silicone composition further comprises a condensation catalyst and the method further comprises curing the curable polyorganosiloxane particle-containing composition in the presence of a condensation catalyst. With regard to the solution comprising the nitrogen-containing base (e.g., nitrogen-containing superbase), the nitrogen-containing base (e.g., nitrogen-containing superbase) is substantially dissolved in the solvent, but the solvent does not substantially dissolve the condensation curable polyorganosiloxane.

Some embodiments include any one of the following numbered aspects.

Aspect 1. A condensation curable silicone composition comprising: a condensation curable polyorganosiloxane; and treated particles comprising a particulate solid having an effective amount of nitrogen-containing superbase disposed thereon; wherein the effective amount of nitrogen-containing superbase disposed on the particulate solid is sufficient to neutralize a substantial number of a plurality of acidic sites on the particulate solid and a substantial number of the acidic sites on the particulate solid are neutralized with the disposed nitrogen-containing superbase.

Aspect 2. The condensation curable silicone composition of aspect 1, wherein the effective amount of nitrogen-containing superbase disposed on the particulate solid is sufficient so that the time necessary for the condensation curable silicone composition to cure and reach a tan delta value equal to 1 is from about 30 seconds to about 1 hour at 150° C.

Aspect 3. The condensation curable silicone composition of aspect 1 or 2, wherein the particulate solid is a particulate filler.

Aspect 4. The condensation curable silicone composition of aspect 3 wherein the particulate filler is a nanoparticulate filler.

Aspect 5. The condensation curable silicone composition of aspect 3 or 4, wherein the particulate filler comprises at least one of $TiO_2$, $SiO_2$, $ZnO$, $ZrO_2$, and $Al_2O_3$.

Aspect 6. The condensation curable silicone composition of aspect 1 or 2, wherein the particulate solid is a particulate phosphor.

Aspect 7. The condensation curable silicone composition of aspect 6, wherein the particulate phosphor is a nanoparticulate phosphor.

Aspect 8. The condensation curable silicone composition of aspect 6 or 7, wherein the particulate phosphor comprises at least one of a cerium-doped phosphor, aluminate phosphor, a silicate phosphor, a garnet phosphor, and a nitride phosphor.

Aspect 9. The condensation curable composition of any one of aspects 1 to 8 wherein the nitrogen-containing superbase is a cycloaliphatic imines of the general formula:

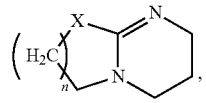

wherein X is $CH_2$ or NR, wherein R is defined herein; and subscript n is an integer from 1 to 3.

Aspect 10. The condensation curable silicone composition of any one of aspects 1 to 9, wherein the nitrogen-containing superbase is at least one of: 1,8-Diazabicyclo[5.4.0]undec-7-ene (DBU); 1,5,7-Triazabicyclo[4.4.0]dec-5-ene (TBD); 1,5-Diazabicyclo[4.3.0]-5-nonene (DBN); and 7-Methyl-1,5,7-triazabicyclo[4.4.0]dec-5-ene (MTBD).

Aspect 11. The condensation curable silicone composition of aspect 10, wherein the nitrogen-containing superbase is at least one of DBU and DBN.

Aspect 12. The condensation curable composition of any one of aspects 1 to 8 wherein the nitrogen-containing superbase is 1,1,3,3-Tetramethylguanidine (TMG).

Aspect 13. The condensation curable silicone composition of any one of aspects 1 to 12, further comprising a catalytically effective amount of a condensation catalyst, wherein the total amount of the nitrogen-containing base disposed on the particulate solid of the treated particles plus the catalytically effective amount of a condensation catalyst disposed in the condensation curable silicone composition is such that the time necessary for the condensation curable silicone composition to cure and reach a tan delta value=1 is at least 30 seconds, but not so much that the time is greater than 65 minutes at 150° C.

Aspect 14. The condensation curable silicone composition of aspect 13, wherein the condensation catalyst is independently the nitrogen-containing superbase.

Aspect 15. The condensation curable silicone composition of any one of aspects 1 to 14, further comprising a diluent.

Aspect 16. The condensation curable silicone composition of any one of aspects 1 to 15, wherein the condensation curable polyorganosiloxane comprises an organosiloxane block copolymer comprising: 0 to 10 mole percent M constituent units of the formula $[R_3SiO_{1/2}]$, 40 to 90 mole percent D constituent units of the formula $[R_2SiO_{2/2}]$, 10 to 60 mole percent T constituent units of the formula $[RSiO_{3/2}]$, and 0.5 to 35 mole percent silicon bonded hydroxy (SiOH); wherein: the sum of the mole percent M, D, and T constituent units is 100 mole percent; each R is independently a $C_1$ to $C_{30}$ hydrocarbyl; the D constituent units $[R_2SiO_{2/2}]$ are arranged in linear blocks having an average of from 50 to 300 D constituent units $[R_2SiO_{2/2}]$ per linear block; the T constituent units $[RSiO_{3/2}]$ are arranged in non-linear blocks having a block weight of at least 500 g/mole; the M constituent units $[R_3SiO1/2]$ are connected to T units; at least 30% of the non-linear blocks are crosslinked with each other; each linear block is linked to at least one non-linear block via —Si—O—Si— linkages; and the organosiloxane block copolymer has a weight average molecular weight of at least 20,000 g/mole.

Aspect 17. A cured product of condensation curing the condensation curable silicone composition of any one of aspects 1 to 16.

Aspect 18. A method for preparing a cured polyorganosiloxane, the method comprising: condensation curing the condensation curable silicone composition of any one of aspects 1 to 16 in the presence of a condensation catalyst; wherein the effective amount of nitrogen-containing superbase disposed on the treated particles is sufficient to neutralize a substantial number of a plurality of acidic sites on untreated particles; to give a cured polyorganosiloxane.

Aspect 19. A method for treating particulate solid having a plurality of acidic sites, the method comprising: contacting the particulate solid with a nitrogen-containing superbase to give treated particles having an effective amount of nitrogen-containing superbase disposed thereon, wherein the effective amount of nitrogen-containing superbase is disposed on the particulate solid and is sufficient to neutralize a substantial number of a plurality of acidic sites on the particulate solid.

Aspect 20. The method of aspect 19, further comprising isolating the treated particles having an effective amount of nitrogen-containing superbase disposed thereon to give isolated treated particles. The isolated treated particles may be in the form of a powder.

Aspect 21. The method of aspect 20, further comprising processing the isolated treated particles having an effective amount of nitrogen-containing superbase disposed thereon to remove therefrom a portion, but not all, of disposed nitrogen-containing superbase to give processed treated particles.

Aspect 22. The method of aspect 21, wherein the processing comprises removing therefrom the portion, but not all, of disposed nitrogen-containing superbase to give processed treated particles such that the time necessary for a condensation curable silicone composition comprising the processed treated particles having an effective amount of nitrogen-containing superbase disposed thereon to cure and reach a tan delta value equal to 1 is from about 30 seconds to about 1 hour at 150° C.

Aspect 23. The method of aspect 21, wherein the processing comprises heating the isolated treated particles having an effective amount of nitrogen-containing superbase disposed thereon at a temperature and for a time sufficient to remove therefrom the portion, but not all, of disposed nitrogen-containing superbase to give processed treated particles such that the time necessary for a condensation curable silicone composition comprising the processed treated particles having an effective amount of nitrogen-containing superbase disposed thereon to cure and reach a tan delta value equal to 1 is from about 30 seconds to about 1 hour at 150° C.

Aspect 24. Treated filler particles comprising a particulate filler having an effective amount of nitrogen-containing superbase disposed thereon.

Aspect 25. The treated filler particles of aspect 24, wherein the nitrogen-containing superbase is a cycloaliphatic imines of the general formula:

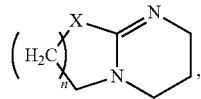

wherein X is $CH_2$ or NR, wherein R is defined herein; and subscript n is an integer from 1 to 3.

Aspect 26. The treated filler particles of aspect 25 wherein the nitrogen-containing superbase is at least one of 1,8-Diazabicyclo[5.4.0]undec-7-ene (DBU); 1,5,7-Triazabicyclo[4.4.0]dec-5-ene (TBD); 1,5-Diazabicyclo[4.3.0]-5-nonene (DBN); and 7-Methyl-1,5,7-triazabicyclo[4.4.0]dec-5-ene (MTBD).

Aspect 27. The treated filler particles of any one of aspects 24 to 26 wherein the particulate filler is a nanoparticulate filler; or wherein the particulate filler comprises at least one of $TiO_2$, $SiO_2$, ZnO, $ZrO_2$, and $Al_2O_3$; or wherein the particulate filler is a nanoparticulate filler and the nanoparticulate filler comprises at least one of $TiO_2$, $SiO_2$, ZnO, $ZrO_2$, and $Al_2O_3$.

Aspect 28. The treated filler particles of any one of aspects 24 or 27, wherein the effective amount of nitrogen-containing superbase disposed on the particulate filler is sufficient to neutralize a substantial number of a plurality of acidic sites on the particulate filler and a substantial number of the acidic sites on the particulate filler are neutralized with the disposed nitrogen-containing superbase; wherein the effective amount of nitrogen-containing superbase disposed on the particulate filler is characterized as being sufficient such that when the treated filler particles are in a condensation curable silicone composition comprising a condensation curable polyorganosiloxane and the treated filler particles, the time necessary for the condensation curable silicone composition to cure and reach a tan delta value equal to 1 at 150° C. is at least 20 seconds less than the time necessary for a comparative condensation curable silicone composition comprising the condensation curable polyorganosiloxane and untreated filler particles (i.e., filler particles free of the nitrogen-containing superbase).

Aspect 29. The treated filler particles of any one of aspects 24 to 28 wherein the treated filler particles are in the form of an isolated powder.

Aspect 30. Treated phosphor particles comprising a particulate phosphor having an effective amount of nitrogen-containing superbase disposed thereon, wherein the effective amount of nitrogen-containing superbase disposed on the particulate phosphor is sufficient to neutralize a substantial number of a plurality of acidic sites on the particulate phosphor and a substantial number of the acidic sites on the particulate phosphor are neutralized with the disposed nitrogen-containing superbase; wherein the effective amount of nitrogen-containing superbase disposed on the particulate phosphor is characterized as being sufficient such that when the treated phosphor particles are used in a condensation curable silicone composition comprising a condensation curable polyorganosiloxane and the treated phosphor particles, the time necessary for the condensation curable silicone composition to cure and reach a tan delta value equal to 1 at 150° C. is at least 20 seconds less than the time necessary for a comparative condensation curable silicone composition comprising the condensation curable polyorganosiloxane and untreated phosphor particles (i.e., phosphor particles free of the nitrogen-containing superbase).

Aspect 31. The treated phosphor particles of aspect 30 wherein the time necessary for the condensation curable silicone composition to cure and reach a tan delta value equal to 1 at 150° C. is at least 50% less than the time necessary for a comparative condensation curable silicone composition comprising the condensation curable polyorganosiloxane and untreated particles (i.e., phosphor particles free of the nitrogen-containing superbase).

Aspect 32. The treated phosphor particles of aspect 30 or 31 wherein the particulate phosphor is a nanoparticulate phosphor; or wherein the particulate phosphor comprises at least one of a cerium-doped phosphor, aluminate phosphor, a silicate phosphor, a garnet phosphor, and a nitride phosphor; or wherein the particulate phosphor is a nanoparticulate phosphor and the nanoparticulate phosphor comprises at least one of a cerium-doped phosphor, aluminate phosphor, a silicate phosphor, a garnet phosphor, and a nitride phosphor.

Aspect 33. The treated phosphor particles of any one of aspects 30 to 32, wherein the nitrogen-containing superbase is a cycloaliphatic imines of the general formula:

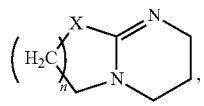

wherein X is $CH_2$ or NR, wherein R is defined herein; and subscript n is an integer from 1 to 3.

Aspect 34. The treated phosphor particles of any one of aspects 30 to 33, wherein the nitrogen-containing superbase is at least one of: 1,8-Diazabicyclo[5.4.0]undec-7-ene (DBU); 1,5,7-Triazabicyclo[4.4.0]dec-5-ene (TBD); 1,5-Diazabicyclo[4.3.0]-5-nonene (DBN); and 7-Methyl-1,5,7-triazabicyclo[4.4.0]dec-5-ene (MTBD).

Aspect 35. Treated phosphor particles comprising a particulate phosphor having an effective amount of nitrogen-containing superbase disposed thereon; wherein the effective amount of nitrogen-containing superbase disposed on the particulate phosphor is sufficient to neutralize a substantial number of a plurality of acidic sites on the particulate phosphor and a substantial number of the acidic sites on the particulate phosphor are neutralized with the disposed nitrogen-containing superbase; and wherein the nitrogen-containing superbase is at least one of 1,8-Diazabicyclo[5.4.0]undec-7-ene (DBU); 1,5,7-Triazabicyclo[4.4.0]dec-5-ene (TBD); 1,1,3,3-Tetramethylguanidine (TMG); 1,5-Diazabicyclo[4.3.0]-5-nonene (DBN); and 7-Methyl-1,5,7-triazabicyclo[4.4.0]dec-5-ene (MTBD).

Aspect 36. The treated phosphor particles of aspect 35 wherein the particulate phosphor is a nanoparticulate phosphor; or wherein the particulate phosphor comprises at least one of a cerium-doped phosphor, aluminate phosphor, a silicate phosphor, a garnet phosphor, and a nitride phosphor; or wherein the particulate phosphor is a nanoparticulate phosphor and the nanoparticulate phosphor comprises at least one of a cerium-doped phosphor, aluminate phosphor, a silicate phosphor, a garnet phosphor, and a nitride phosphor.

Aspect 37. The treated phosphor particles of aspect 35 or 36, wherein the nitrogen-containing superbase is at least one of 1,8-Diazabicyclo[5.4.0]undec-7-ene (DBU); 1,5,7-Triazabicyclo[4.4.0]dec-5-ene (TBD); 1,5-Diazabicyclo[4.3.0]-5-nonene (DBN); and 7-Methyl-1,5,7-triazabicyclo[4.4.0]dec-5-ene (MTBD).

Aspect 38. The treated phosphor particles of any one of aspects 24 to 37, wherein the nitrogen-containing superbase is at least one of 1,8-Diazabicyclo[5.4.0]undec-7-ene (DBU) and 1,5-Diazabicyclo[4.3.0]-5-nonene (DBN).

Aspect 39. The treated phosphor particles of any one of aspects 24 to 37, wherein the nitrogen-containing superbase is at least one of 1,5,7-Triazabicyclo[4.4.0]dec-5-ene (TBD); and 7-Methyl-1,5,7-triazabicyclo[4.4.0]dec-5-ene (MTBD).

Aspect 40. The treated phosphor particles of any one of aspects 24 to 39 wherein the treated phosphor particles are in the form of an isolated powder.

Aspect 41. The treated phosphor particles of any one of aspects 24 to 40 wherein the treated phosphor particles have been further processed to remove some, but not all, of the superbase therefrom to give processed treated phosphor particles that contain some superbase disposed thereon do not contain a monolithic coating or film of the superbase on the surface of the phosphor particles.

Aspect 42. A delivery composition for delivering a nitrogen-containing superbase to untreated phosphor particles, the delivery composition comprising a nitrogen-containing superbase and an organic solvent, wherein the nitrogen-containing superbase is a cycloaliphatic imines of the general formula:

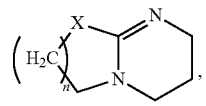

wherein X is $CH_2$ or NR, wherein R is defined herein; and subscript n is an integer from 1 to 3.

Aspect 43. The delivery composition of aspect 42 wherein the nitrogen-containing superbase is at least one of 1,8-Diazabicyclo[5.4.0]undec-7-ene (DBU); 1,5,7-Triazabicyclo[4.4.0]dec-5-ene (TBD); 1,5-Diazabicyclo[4.3.0]-5-nonene (DBN); and 7-Methyl-1,5,7-triazabicyclo[4.4.0]dec-5-ene (MTBD).

Aspect 44. The delivery composition of aspect 42 or 43 further comprising the untreated phosphor particles.

Aspect 45. A delivery composition for delivering treated phosphor particles to a condensation curable polyorganosiloxane in a method for making a condensation curable silicone composition comprising the condensation curable polyorganosiloxane and the treated phosphor particles, wherein the time necessary for the condensation curable silicone composition to cure and reach a tan delta value equal to 1 at 150° C. is at least 20 seconds less than the time necessary for a comparative condensation curable silicone composition comprising the condensation curable polyorganosiloxane and untreated phosphor particles (i.e., phosphor particles free of the nitrogen-containing superbase); the delivery composition comprising the treated phosphor particles of any one of aspects 24 to 41 and an organic solvent.

Aspect 46. A delivery composition for delivering treated phosphor particles to a condensation cured polyorganosiloxane in a method for making a condensation cured silicone composition comprising a cured product of curing a condensation curable silicone composition comprising polyorganosiloxane and the treated phosphor particles, wherein the time necessary for the condensation curable silicone composition to cure and reach a tan delta value equal to 1 at 150° C. is at least 20 seconds less than the time necessary for a comparative condensation curable silicone composition comprising the condensation curable polyorganosiloxane and untreated phosphor particles (i.e., phosphor particles free of the nitrogen-containing superbase); the delivery composition comprising the treated phosphor particles of any one of aspects 24 to 41 and an organic solvent.

Aspect 47. The delivery composition of aspect 45 or 46, wherein the nitrogen-containing superbase is a cycloaliphatic imines of the general formula:

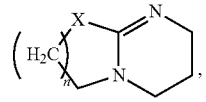

wherein X is $CH_2$ or NR, wherein R is defined herein; and subscript n is an integer from 1 to 3.

Aspect 48. The delivery composition of aspect 47, wherein the nitrogen-containing superbase is at least one of 1,8-Diazabicyclo[5.4.0]undec-7-ene (DBU); 1,5,7-Triazabicyclo[4.4.0]dec-5-ene (TBD); 1,5-Diazabicyclo[4.3.0]-5-nonene (DBN); and 7-Methyl-1,5,7-triazabicyclo[4.4.0]dec-5-ene (MTBD).

Aspect 49. The delivery composition of any one of aspects 42 to 48 wherein the nitrogen-containing superbase is at least one of 1,8-Diazabicyclo[5.4.0]undec-7-ene (DBU); and 1,5-Diazabicyclo[4.3.0]-5-nonene (DBN).

Aspect 50. The delivery composition of any one of aspects 42 to 48, wherein the nitrogen-containing superbase is at least one of 1,5,7-Triazabicyclo[4.4.0]dec-5-ene (TBD); and 7-Methyl-1,5,7-triazabicyclo[4.4.0]dec-5-ene (MTBD).

Aspect 51. The delivery composition of any one of aspects 42 to 50 wherein the organic solvent is a $(C_6-C_{10})$ hydrocarbon, a $(C_1-C_5)$ alcohol, or a combination of any two or more thereof.

Aspect 52. The delivery composition of aspect 51 wherein the organic solvent is toluene or 1-methylethanol.

Aspect 53. Use of a delivery composition to deliver a nitrogen-containing superbase to untreated phosphor particles in a method for making the treated phosphor particles of any one of aspects 24 to 37, wherein the delivery composition comprises a nitrogen-containing superbase and an organic solvent, wherein the nitrogen-containing superbase is at least one of 1,8-Diazabicyclo[5.4.0]undec-7-ene (DBU); 1,5,7-Triazabicyclo[4.4.0]dec-5-ene (TBD); 1,5-Diazabicyclo[4.3.0]-5-nonene (DBN); and 7-Methyl-1,5,7-triazabicyclo[4.4.0]dec-5-ene (MTBD).

Aspect 54. Use of a delivery composition to deliver treated phosphor particles to a condensation curable polyorganosiloxane in a method for making a condensation curable silicone composition comprising the condensation curable polyorganosiloxane and the treated phosphor particles, wherein the time necessary for the condensation curable silicone composition to cure and reach a tan delta value equal to 1 at 150° C. is at least 20 seconds less than the time necessary for a comparative condensation curable silicone composition comprising the condensation curable polyorganosiloxane and untreated phosphor particles (i.e., phosphor particles free of the nitrogen-containing superbase); wherein the delivery composition comprises the treated phosphor particles of any one of aspects 24 to 37 and an organic solvent.

Aspect 55. Use of a delivery composition to deliver treated phosphor particles to a condensation cured polyorganosiloxane in a method for making a condensation cured silicone composition comprising a cured product of curing a condensation curable silicone composition comprising polyorganosiloxane and the treated phosphor particles, wherein the time necessary for the condensation curable silicone composition to cure and reach a tan delta value equal to 1 at 150° C. is at least 20 seconds less than the time necessary for a comparative condensation curable silicone composition comprising the condensation curable polyorganosiloxane and untreated phosphor particles (i.e., phosphor particles free of the nitrogen-containing superbase); wherein the delivery composition comprises the treated phosphor particles of any one of aspects 24 to 37 and an organic solvent.

Aspect 56. The use of aspect 54 or 55 wherein the condensation curable silicone composition is of any one of aspects 1 to 16.

Aspect 57. The use of any one of aspects 54 to 56, wherein the nitrogen-containing superbase is at least one of 1,8-Diazabicyclo[5.4.0]undec-7-ene (DBU); 1,5,7-Triazabicyclo[4.4.0]dec-5-ene (TBD); 1,5-Diazabicyclo[4.3.0]-5-nonene (DBN); and 7-Methyl-1,5,7-triazabicyclo[4.4.0]dec-5-ene (MTBD).

Aspect 58. The use of any one of aspects 53 to 57 wherein the nitrogen-containing superbase is at least one of 1,8-Diazabicyclo[5.4.0]undec-7-ene (DBU); and 1,5-Diazabicyclo[4.3.0]-5-nonene (DBN).

Aspect 59. The use of any one of aspects 53 to 57 wherein the nitrogen-containing superbase is at least one of 1,5,7-Triazabicyclo[4.4.0]dec-5-ene (TBD); and 7-Methyl-1,5,7-triazabicyclo[4.4.0]dec-5-ene (MTBD).

Aspect 60. The use of any one of aspects 53 to 59 wherein the organic solvent is a $(C_6-C_{10})$ hydrocarbon, a $(C_1-C_5)$ alcohol, or a combination of any two or more thereof.

Aspect 61. The use of aspect 60 wherein the organic solvent is toluene or 1-methylethanol.

Aspect 62. A method for treating a curable polyorganosiloxane particle-containing composition, the method comprising: treating a composition comprising the condensation curable polyorganosiloxane and untreated particles with a solution comprising a solvent and a nitrogen-containing superbase in an effective amount sufficient to neutralize a substantial number of a plurality of acidic sites on the untreated particles; wherein the solution comprising the nitrogen-containing superbase does not substantially dissolve the condensation curable polyorganosiloxane.

Aspect 63. The method of aspect 62, wherein the curable polyorganosiloxane particle-containing composition is a coating or film.

Aspect 64. The method of aspect 62 or 63, further comprising curing the curable polyorganosiloxane particle-containing composition in the presence of a condensation catalyst.

The term "substantially" as used herein refers to a majority of, or mostly, as in at least about 90%, alternatively at least 95%, alternatively at least 96%, alternatively at least 97%, alternatively at least 98%, alternatively at least 99%, alternatively at least 99.5%, alternatively at least 99.9%, alternatively at least 99.99%, alternatively at least at least about 99.999% or more; and in some embodiments 100%, alternatively at most <100%.

The term "not substantially" as used herein refers to a minority of, as in less than about 10%, alternatively less than 5%, alternatively less than 4%, alternatively less than 3%, alternatively less than 2%, alternatively less than 1%, alternatively less than 0.5%, alternatively less than 0.1%, alternatively less than 0.01%, alternatively less than about 0.001 or less; and in some embodiments 0%, alternatively at least >0%.

The term "about," as used herein, can allow for a degree of variability in a value or range, for example, within 10%, alternatively within 5%, alternatively within 1% of a stated value or of a stated limit of a range.

Values expressed in a range format should be interpreted in a flexible manner to include not only the numerical values explicitly recited as the limits of the range, but also to include all the individual numerical values or sub-ranges encompassed within that range as if each numerical value and sub-range were explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range.

Embodiments of the invention described and claimed herein are not to be limited in scope by the specific embodiments herein disclosed, since these embodiments are intended as illustration of several aspects of the disclosure. Any equivalent embodiments are intended to be within the scope of this disclosure. Indeed, various modifications of the embodiments in addition to those shown and described herein will become apparent to those skilled in the art from the foregoing description. Examples of such modifications include combining any two embodiments to form a third embodiment, such as combining a particular nitrogen-containing base (e.g., nitrogen-containing superbase) with a particular phosphor to form an embodiment of the treated particles; or combining a particular condensation catalyst with a particular nitrogen-containing base (e.g., nitrogen-containing superbase) used to treat the particulate solid and prepare the treated particles to form an embodiment of the condensation curable silicone composition. Such modifications are also intended to fall within the scope of the appended claims.

The Abstract is provided to allow the reader to quickly ascertain the nature of the technical disclosure. It is submitted with the understanding that it will not be used to interpret or limit the scope or meaning of the claims.

EXAMPLES

The following examples are included to demonstrate specific embodiments of the invention. However, many changes can be made in the specific embodiments which are disclosed and still obtain a like or similar result without departing from the spirit and scope of the invention.

Example 1: Preparation of $(PhMeSiO_{2/2})_{0.52}(PhSiO_{3/2})_{0.42}$ (45 wt % Phenyl-T)

A 500 mL 4-neck round bottom flask was loaded with Dow wt Corning 217 Flake (45.0 g, 0.329 moles Si) and toluene (Fisher Scientific, 70.38 g). The flask was equipped with a thermometer, Teflon stir paddle, and a Dean Stark apparatus attached to a water-cooled condenser. A nitrogen blanket was applied; the Dean Stark apparatus was prefilled with toluene; and an oil bath was used for heating. The reaction mixture was heated at reflux for 30 minutes. After cooling the reaction mixture to 108° C., a solution of diacetoxy terminated PhMe siloxane was added quickly. The diacetoxy terminated PhMe siloxane was prepared by adding a 50/50 wt % MTA/ETA (methyltriacetoxysilane/ethyltriacetoxysilane) (1.21 g, 0.00523 moles Si) mixture to a solution of 140 dp (degree of polymerization) silanol terminated PhMe siloxane (55.0 g, 0.404 moles Si) dissolved in toluene (29.62 g). The solution was mixed for 2 hours at room temperature under a nitrogen atmosphere. After the diacetoxy terminated PhMe siloxane was added, the reaction mixture was heated at reflux for 2 hours. At this stage 50/50 wt % MTA/ETA (7.99 g, 0.0346 moles Si) was added at 108° C. The reaction mixture was heated at reflux for an additional 1 hour. The reaction mixture was cooled to 90° C. and then deionized (DI) water (12 mL) was added. The temperature was increased to reflux and the water was removed by azeotropic distillation. The reaction mixture was cooled again to 90° C. and more DI water (12 mL) was added. The reaction mixture was once again heated up to reflux and the water was removed. Some toluene (56.9 g) was then removed by distillation to increase the solids content. The material was cooled to room temperature and then pressure filtered through a 5.0 µm filter.

Example 2

A 1,8-Diazabicycloundec-7-ene (DBU) solution (0.1 wt %) was prepared by dissolving 100 mg DBU in 99.9 g toluene. Intematix RR6436 phosphor (RR6436-02A-12, 1 g; Intematix Corp., Freemont, Calif.; a Eu-doped nitride phosphor) was charged into a glass vial. Then 10 g of the 0.1 wt % DBU solution in toluene was charged to the vial. The vial was capped and put on a rotary mixer for 20 hours. Then the resulting treated phosphor was filtered out from the solution using filter paper. The wet phosphor cake is transferred to an oven and dried at 150° C. for 4 hours.

Example 3

Intematix O5446 phosphor (5 g; Intematix Corp., Freemont, Calif.; a Eu-doped silicate phosphor) was charged into a glass vial. Then 10 g of 0.5 wt % DBU solution in toluene was charged to the vial. The vial was capped and put on a rotary mixer for 2 hours. Then the resulting treated phosphor was filtered out from the solution using filter paper. The wet phosphor cake was transferred to an oven and dried at 150° C. for 4 hours.

Example 4

Intematix GAL535-L phosphor (20 g; Intematix Corp., Freemont, Calif.; a Eu- or Ce-doped aluminate phosphor) was charged into a glass vial. Then 20 g of 1 wt % DBU solution in toluene was charged to the vial. The vial was capped and put on a rotary mixer for 2 hours. Then the resulting treated phosphor was filtered out from the solution using filter paper. The wet phosphor cake was transferred to an oven and dried at 150° C. for 16 hours.

Example 5

$TiO_2$ (5 g; Sigma-Aldrich, St. Louis, Mo.) was charged into a glass vial. Then 10 g of 1 wt %. DBU solution in toluene was charged to the vial. The vial was capped closely and put on a rotary mixer for 2 hours. Then the resulting treated $TiO_2$ particles were filtered out from the solution using filter paper. The wet $TiO_2$ cake was transferred to an oven and dried at 150° C. for 16 hours.

Comparative Example (CE) A(1): Treatment with Toluene, not Base

Intematix RR6436-02A-12 phosphor (2 g; Intematix Corp., Freemont, Calif.) was charged into a glass vial. Then 2 g of toluene was charged to the vial. The vial was capped and put on a rotary mixer for 2 hours. Then the phosphor was filtered out from the solution using filter paper. The wet phosphor cake was transferred to an oven and dried at 150° C. for 16 hours.

Example 6: Rheology Measurement

An IT LF-1000 phosphor film binder (Dow Corning, Midland, Mich.) was used as the base material. DBU as the curing catalyst that was prepared as 1000 ppm solution in toluene (described below in Sample 2 of Example 2) was added to the IT LF-1000 at the loading of 5 ppm to the dry resin. The phosphor from Example 1 was mixed into the binder with catalyst at a loading of 2 parts per 100 parts of dry resin (2%). The binder containing DBU and the treated phosphor from Example 1 was prepared into thin film and dried at 70° C. oven for half an hour to remove solvents. Also, a binder film containing DBU and the phosphor from Example 5 was also prepared.

Comparative Example (CE) B(1)

A blank binder film containing DBU but no phosphor was also prepared. Comparative Example (CE) C(1): Finally, binder film containing DBU and untreated RR6436 (i.e., not treated with DBU in toluene or with just toluene, as in Example 5) was prepared at 2% loading.

The films were used to measure curing and rheology properties on an Ares rheometer (TA instruments, USA) using the temperature profile of 70° C. ramp up to 150° C. at 20° C./min, then dwell at 150° C. for 40 minutes. Minimum G', maximum tan δ, and the time for the film to cure and reach tan δ=1 from the point that temperature reaches 150° C. were recorded. The results are listed in Table 1.

TABLE 1

| Sample | Phosphor type | G' (kPa) | Tan δ | Time to tan δ = 1 (min) |
|---|---|---|---|---|
| 1 (CE B(1)) | No phosphor (Blank) | 0.58 | 2.58 | 22.9 |
| 2 | Example 2 | 1.15 | 1.77 | 4.4 |
| 3 (CE C(1)) | Untreated RR6436 | 0.53 | 2.75 | >1000 |
| 4 | CE A(1) | 0.48 | 2.68 | >1000 |

As can be seen from Table 1, adding untreated (Sample 3, CE C(1)) or toluene treated phosphor RR6436 (Sample 4, CE A(1)) to a 5 ppm DBU loaded resin results in a time to tan d=1>1000 minutes, which means that the comparative samples do not cure. Since the blank without phosphor (Sample 1, CE B(1)) cures in 22.9 minutes, the data in Table 1 suggest that the phosphor particles in Sample 3 (CE C(1)) and Sample 4 (CE A(1)) appear to inhibit cure. In contrast, the inventive treated phosphor particles of Sample 2 (Example 2) result in a cured product.

Examples 7-9 and Comparative Examples B(2) to B(4) and C(2) to C(4)

Other phosphors and other particles, namely O5446, GAL535, and $TiO_2$ were used to prepare resin thin films for rheology test in the same fashion as in Example 6. All were at 2% loading. The catalyst level was at 5 ppm. The rheology properties of blank, untreated, and treated were compared in Table 2.

TABLE 2

| Sample | Phosphor type | G' (kPa) | Tan δ | Time to tan δ = 1 (min) |
|---|---|---|---|---|
| Blank (CE B(2)) | No phosphor | 0.58 | 2.58 | 22.9 |
| O5446 (Example 7) | Treated | 1.15 | 1.72 | 2.2 |
| O5446 (CE C(2)) | Untreated | 0.62 | 2.53 | 26.4 |
| Blank (CE B(3)) | No phosphor | 0.56 | 2.47 | 17.5 |
| GAL535 (Example 8) | Treated | 0.58 | 2.44 | 18.4 |
| GAL535 (CE C(3)) | Untreated | 0.56 | 2.49 | 18.9 |
| Blank (CE B(4)) | No phosphor | 0.44 | 2.73 | 14.1 |

TABLE 2-continued

| Sample | Phosphor type | G' (kPa) | Tan δ | Time to tan δ = 1 (min) |
|---|---|---|---|---|
| $TiO_2$ (Example 9) | Treated | 0.70 | 2.08 | 8.3 |
| $TiO_2$ (CE C(4)) | Untreated | 0.34 | 3.27 | >1000 |

The same conclusion can be drawn from Table 2 as was determined from Table 1: treatment of the phosphors or $TiO_2$ enables fast cure whereas slower cure is seen for untreated particles.

Example 10-12 and Comparative Examples B(5) and C(5) to C(7)

Phosphors and other particles were used to prepare resin thin films for rheology test. All were at 150 parts particle loading per 100 parts of silicone matrix-forming precursors (not counting weight of any organic solvent). The catalyst level was at 20 ppm. The rheology properties of blank, untreated, and treated were compared in Table 3.

TABLE 3

| Sample | Phosphor type | G' (kPa) | Tan δ | Time to tan δ = 1 (min) |
|---|---|---|---|---|
| Blank (CE B(5)) | No phosphor | 5.69 | 1.45 | 1.0 |
| EY4453 (Example 10) | Treated | 44.03 | 1.31 | Before 150° C. |
| EY4453 (CE C(5)) | Untreated | 29.97 | 1.32 | Before 150° C. |
| GAL535-L (Example 11) | Treated | 29.47 | 1.29 | Before 150° C. |
| GAL535-L (CE C(6)) | Untreated | 4.78 | 1.8 | 9.5 |
| NYAG4354 (Example 12) | Treated | 40.32 | 1.3 | Before 150° C. |
| NYAG4354 (CE C(7)) | Untreated | 4.83 | 1.8 | 9.5 |

Example 13: Treating Phosphor with Water Solution and Comparative Example B(6)

A 1,8-Diazabicycloundec-7-ene (DBU) solution (0.5 wt %) was prepared by dissolving 100 mg DBU in 19.9 g deionized water. Intematix RR6436 phosphor (RR6436-02A-12, 2 g; Intematix Corp., Freemont, Calif.) was charged into a glass vial. Then 10 g of the 0.5 wt % DBU solution in water was charged to the vial. The vial was capped and put on a rotary mixer for 4 hours. Then the phosphor was filtered out from the solution using filter paper. The wet phosphor cake is transferred to an oven and dried at 150° C. for 16 hours. The treated phosphor was used to prepare resin film at 2% loading with 5 ppm DBU. The rheology results are listed in Table 4.

TABLE 4

| Sample | Phosphor type | G' (kPa) | Tan δ | Time to tan δ = 1 (min) |
|---|---|---|---|---|
| Blank (CE B(6)) | No phosphor | 0.47 | 2.54 | 14.0 |
| RR6436-02A-12 (Example 13) | Treated | 0.67 | 2.22 | 9.4 |

Examples 14A to 14e: Treating a Phosphor Containing Polyorganosiloxane Film with the Nitrogen-Containing Superbase Solution This example describes a method to invoke cure of a solid phosphor containing film cast from a toluene solution by using an aqueous solution of DBU and exposing the solid film to this solution for different amounts of time and using different DBU concentrations.

The following ingredients were used: polyorganosiloxane from Example 1, toluene, DBU, water and a siliconized PET release film, and NYAG4454L from Intematix.

Phosphor was mixed with the polyorganosiloxane solution in toluene at 75 wt % solids. The phosphor loading thus achieved corresponds to 60 wt % of phosphor as compared to solids (=phosphor and solid polyorganosiloxane). This slurry was mixed using a planetary mixer. After mixing the slurry was coated using a doctor blade method on a siliconized PET film from Mitsubishi. The wet film was placed in a forced air furnace for 30 minutes at 70° C. to remove toluene. The obtained phosphor film on the siliconized PET carrier was introduced in DBU/water solutions of different concentration for different amounts of time. After exposure, the films were rinsed with copious amounts of deionized water and dried in air for 20 minutes. The table below illustrates how increasing either the concentration or time of exposure results in an increase in cure speed (or decrease in time to tan delta=1 at 150° C.) in seconds.

TABLE 5

| Example | DBU, wt % in water | Treatment time, s | Time to tan δ = 1, s |
|---|---|---|---|
| 14a | 1 | 150 | 5 |
| 14b | 1 | 60 | 58 |
| 14c | 0.5 | 150 | 70 |
| 14d | 0.5 | 60 | 190 |
| 14e | 0.1 | 3600 | 5 |

Examples 15a and 15b and Comparative Examples B(7) and C(8): Treating a Phosphor Containing Polyorganosiloxane Film with the Nitrogen-Containing Base Solution Consisting of Dioctylamine in Toluene Intematix NYAG4454-S phosphor was treated with 1 wt % dioctylamine (DOA) in toluene for 4 hours, and then the mixture was dried at 150° C. in an oven for 16 hours to give a DOA-treated phosphor.

In different experiments 2 g treated phosphor was mixed with 4 g solids polyorganosiloxane in a solution in toluene at 75 wt % solids, and with and without addition of 5 ppm DBU The phosphor loading thus achieved corresponds to 33 wt % of phosphor as compared to 6 g solids (=2 g phosphor and 4 g solid polyorganosiloxane). This slurry was mixed using a planetary mixer. After mixing the slurry was coated using a doctor blade method on a siliconized PET film from Mitsubishi. The wet film was dried in a forced air furnace for 30 minutes at 70° C. to remove toluene. The dried film was folded and pressed as a 1 mm thick film for the 150° C. tan delta=1 test The data in the table below illustrate that the DOA treatment of phosphors does not prevent DBU from binding to the surface of the phosphors.

TABLE 6

| Sample | DBU (ppm) | Phosphor (0% or 33% loading) | G' (kPa) | Tan δ | Time to tan δ = 1 (min) |
|---|---|---|---|---|---|
| Blank (CE B(7)) | 5 | No phosphor | 0.45 | 2.58 | 13.6 |
| NYAG4454-S (CE C(8)) | 5 | Untreated | 0.44 | 3.55 | Did not cure |
| Example 15a | 5 | DOA treated | 0.45 | 3.37 | Did not cure |
| Example 15b | 0 | DOA treated | 0.43 | 3.42 | Did not cure |

As shown by the data in Table 5 versus the data in Table 6, the DBU performs significantly better as a phosphor treating agent used in conjunction with DBU as a condensation catalyst in Examples 14a-14e than does an acyclic amine such as dioctylamine (DOA) perform as a phosphor treating agent when used in conjunction with DBU as a condensation catalyst as shown later in Examples 15a-15b (Table 6). That is, when DBU is used as both a phosphor treating agent and a condensation catalyst Examples 14a-14e (Table 5), it increases curing speed as measured by the respective times to tan delta=1 at 150° C. for condensation curable silicone compositions. But when DOA is used as the phosphor treating agent and DBU as the condensation catalyst, the condensation curable silicone composition did not cure. Based on the results with DBU, it is also expected that the TBD, DABCO, TMG, DBN and MTBD when used as both phosphor treating agent and condensation catalyst would perform significantly better than an acyclic amine such as dioctylamine (DOA) used as a phosphor treating agent in conjunction with the TBD, DABCO, TMG, DBN and MTBD, respectively, as the condensation catalyst, in terms of increasing curing speed as measured by the same method. Without wishing to be bound by a theory, it is believed that the DBU rapidly displaced the DOA from the DOA-treated phosphor particles to give in situ generated DBU-treated phosphor particles and DOA as an (inferior) condensation catalyst.

The data in the Tables show that a weak amine such as dioctylamine that has been used to treat the particulate solid such as the particulate phosphor has no measurable positive affect on cure speed of curing of the condensation curable composition such as the condensation curable silicone composition. In other words, in contrast to using the aforementioned treated particles containing a superbase in combination with a superbase condensation catalyst, when the treated particles containing the weak amine are used in combination with a superbase condensation catalyst in a condensation curable composition, such as the condensation curable silicone composition, the superbase that is the condensation catalyst displaces the weak amine from the treated particles in situ, and the cure speed thereof is not improved. Thus, in some embodiments additional nitrogen-containing base (e.g., nitrogen-containing superbase) is added to give the condensation curable silicone composition, and the nitrogen-containing superbase of the treated particles and the condensation catalyst each independently is the aforementioned superbase in the condensation curable composition, such as the condensation curable silicone composition, which thus have improved cure speeds.

Example 16 (Prophetic)

A 1,8-Diazabicycloundec-7-ene (DBU) solution (0.1 wt %) is prepared by dissolving 100 mg DBU in 99.9 g 1-methylethanol. Intematix RR6436 phosphor (RR6436-02A-12, 1 g; Intematix Corp., Freemont, Calif.; a Eu-doped nitride phosphor) is charged into a glass vial. Then 10 g of the 0.1 wt % DBU solution in 1-methylethanol is charged to the vial. The vial is capped and put on a rotary mixer for 20 hours. Then the resulting treated phosphor is filtered out from the solution using filter paper. The wet phosphor cake is transferred to an oven and dried at 150° C. for 4 hours.

Example 17 (Prophetic)

Intematix O5446 phosphor (5 g; Intematix Corp., Freemont, Calif.; a Eu-doped silicate phosphor) is charged into a glass vial. Then 10 g of 0.5 wt % DBU solution in 1-methylethanol is charged to the vial. The vial is capped and put on a rotary mixer for 2 hours. Then the resulting treated phosphor is filtered out from the solution using filter paper. The wet phosphor cake is transferred to an oven and dried at 150° C. for 4 hours.

Example 18 (Prophetic)

Intematix GAL535-L phosphor (20 g; Intematix Corp., Freemont, Calif.; a Eu- or Ce-doped aluminate phosphor) is charged into a glass vial. Then 20 g of 1 wt %. DBU solution in 1-methylethanol is charged to the vial. The vial is capped and put on a rotary mixer for 2 hours. Then the resulting treated phosphor is filtered out from the solution using filter paper. The wet phosphor cake is transferred to an oven and dried at 150° C. for 16 hours.

Example 19 (Prophetic)

$TiO_2$ (5 g; Sigma-Aldrich, St. Louis, Mo.) is charged into a glass vial. Then 10 g of 1 wt % DBU solution in 1-methylethanol is charged to the vial. The vial is capped closely and put on a rotary mixer for 2 hours. Then the resulting treated $TiO_2$ particles are filtered out from the solution using filter paper. The wet $TiO_2$ cake is transferred to an oven and dried at 150° C. for 16 hours.

Example 20 (Prophetic)

A 1,5-Diazabicyclo[4.3.0]-5-nonene (DBN) solution (0.1 wt %) is prepared by dissolving 100 mg DBN in 99.9 g 1-methylethanol. Intematix RR6436 phosphor (RR6436-02A-12, 1 g; Intematix Corp., Freemont, Calif.; a Eu-doped nitride phosphor) is charged into a glass vial. Then 10 g of the 0.1 wt % DBN solution in 1-methylethanol is charged to the vial. The vial is capped and put on a rotary mixer for 20 hours. Then the resulting treated phosphor is filtered out from the solution using filter paper. The wet phosphor cake is transferred to an oven and dried at 150° C. for 4 hours.

Example 21 (Prophetic)

Intematix O5446 phosphor (5 g; Intematix Corp., Freemont, Calif.; a Eu-doped silicate phosphor) is charged into a glass vial. Then 10 g of 0.5 wt % DBU solution in 1-methylethanol is charged to the vial. The vial is capped and put on a rotary mixer for 2 hours. Then the resulting treated phosphor is filtered out from the solution using filter paper. The wet phosphor cake is transferred to an oven and dried at 150° C. for 4 hours.

Example 22 (Prophetic)

Intematix GAL535-L phosphor (20 g; Intematix Corp., Freemont, Calif.; a Eu- or Ce-doped aluminate phosphor) is charged into a glass vial. Then 20 g of 1 wt % 1,1,3,3-tetramethylguanidine (TMG) solution in toluene is charged to the vial. The vial is capped and put on a rotary mixer for 2 hours. Then the resulting treated phosphor is filtered out from the solution using filter paper. The wet phosphor cake is transferred to an oven and dried at 150° C. for 16 hours.

Example 23 (Prophetic)

$SiO_2$ (5 g; Sigma-Aldrich, St. Louis, Mo.) is charged into a glass vial. Then 10 g of 1 wt % DBU solution in toluene is charged to the vial. The vial is capped closely and put on a rotary mixer for 2 hours. Then the resulting treated $SiO_2$ particles are filtered out from the solution using filter paper. The wet $SiO_2$ cake is transferred to an oven and dried at 150° C. for 16 hours.

Examples 24a and 24b and Comparative Examples B(8) and C(9): treating phosphor with an isopropanol solution of DBU, no phosphor, or untreated phosphor.

Example 24a

An amount of 100 mg of DBU was dissolved in 19.9 g isopropanol (IPA) to give a solution of 1,8-diazabicycloundec-7-ene (DBU) (0.5 wt %). Intematix YAG phosphor (NYAG4454S, 15 g; Intematix Corp., Freemont, Calif.) was charged into a glass vial. Then 15 g of the 0.5 wt % DBU solution in IPA was charged to the vial. The vial was capped and put on a rotary mixer for 4 hours. Then the resulting treated phosphor was filtered out from the solution using filter paper. The wet cake of treated phosphor was transferred to an oven and dried at 150° C. for 16 hours to give a DBU treated phosphor of Example 24a containing 0.50 wt % DBU. Example 24b: the treated phosphor was used to prepare resin film at 10% loading and an additional 5 ppm DBU condensation catalyst. Comparative Example B(8): a film that lacked (was free of) phosphor and DBU was prepared. Comparative Example C(9): a film that contained untreated NYAG4454S phosphor was prepared. The rheology results for Example 24b (treated phosphor) and Comparative Examples B(8) (no phosphor) and C(9) (untreated phosphor) are listed below in Table 7.

TABLE 7

| Sample | DBU (ppm) | Phosphor (0% or 10% loading) | G' (kPa) | Tan δ | Time to tan δ = 1 (minutes) |
|---|---|---|---|---|---|
| Blank (CE B(8)) | 5 | No phosphor | 0.84 | 2.23 | 16.0 |
| NYAG4454-S (CE C(9)) | 5 | Untreated | 0.72 | 2.41 | 25.1 |
| Example 24b | 0 | DBU treated | 0.83 | 2.15 | 13.1 |

Examples 25a1 to 25a11 and 25b1 to 25b11 and Comparative Examples B(9) and C(10) to C(12)

Examples 25a1 to 25a11: Three phosphors (GAL535, NYAG4156, and R6832, all from Intematix) were used to prepare resin thin films for rheology tests. The phosphor treatment with DBU is similar to the treatment of Example 24a above, but the drying temperature was varied from 120° to 225° C. and drying time was varied from 4 hours to 120 hours, respectively, to give DBU treated phosphors of Examples 25a1 to 25a11. Examples 25b1 to 25b11: the treated phosphors of Examples 25a1 to 25a11 were used to prepare resin films of Examples 25b1 to 25b11, respectively, with an additional 5 ppm DBU condensation catalyst. The treated phosphor loading for R6832 was 5 wt % and treated phosphor loadings for GAL535 and NYAG4156 were each 50 wt %. Comparative Example B(9): a film that lacked (was free of) phosphor and DBU was prepared. Comparative Examples C(10) to C(12): a film that contained untreated phosphor was prepared. The rheology results for Examples 24b (treated phosphor) and Comparative Examples B(9) (no phosphor) and C(10) to C(12)(untreated phosphor) are listed below in Table 8.

surface is about neutral or is neutral (free of acidic sites and containing no excess DBU). We contemplate such optimally treated phosphors, as well as less than optimally treated phosphors. Films of the condensation curable silicone composition containing the less than optimally treated phosphors may still exhibit some enhancement of cure speed.

The terms and expressions that have been employed are used as terms of description and not of limitation, and there is no intention in the use of such terms and expressions of excluding any equivalents of the features shown and

TABLE 8

| Drying Temp (° C.) | Drying Time (min) | Min G' (kPa) | | | Max tan delta | | | Time @ tan delta = 1 (minutes) | | |
|---|---|---|---|---|---|---|---|---|---|---|
| | | GAL535 | NYAG4156 | R6832 | GAL535 | NYAG4156 | R6832 | GAL535 | NYAG4156 | R6832 |
| Blank (CEB(9)) | NA | | 0.46 | | | 2.76 | | | 15.8 | |
| untreated | NA | 0.45 | 0.63 | 0.41 | 3.82 | 3.14 | 2.95 | 58 CEC(10) | 118 CEC(11) | 17 CEC(12) |
| 150 (Ex. 25b1) | 4 | 2.71 | 3.68 | 0.57 | 1.53 | 1.43 | 2.74 | 0.8 | 0.7 | 8.8 |
| 120 (Ex. 25b1) | 16 | 4.20 | 5.11 | 0.82 | 1.32 | 1.27 | 1.92 | 0.0 | 0.0 | 2.4 |
| 130 (Ex. 25b1) | 16 | 3.15 | 2.98 | 0.72 | 1.43 | 1.46 | 2.40 | 0.4 | 0.7 | 4.8 |
| 140 (Ex. 25b1) | 16 | 1.66 | 1.37 | 0.56 | 1.56 | 1.99 | 2.52 | 1.9 | 6.3 | 6.2 |
| 150 (Ex. 25b1) | 16 | 1.95 | 2.39 | 0.69 | 1.63 | 1.75 | 2.20 | 1.6 | 2.3 | 6.6 |
| 175 (Ex. 25b1) | 16 | 1.22 | 1.40 | 0.46 | 2.21 | 2.21 | 3.07 | 7.1 | 9.2 | 17 |
| 200 (Ex. 25b1) | 16 | 0.65 | 0.62 | 0.52 | 3.09 | 3.43 | 3.11 | 47 | 79 | 23 |
| 225 (Ex. 25b1) | 16 | 0.51 | 0.53 | 0.43 | 3.99 | 3.66 | 3.51 | 94 | 78 | 25 |
| 150 (Ex. 25b1) | 24 | 1.64 | 1.89 | 0.67 | 1.67 | 1.98 | 2.26 | 2.4 | 5.1 | 8.2 |
| 150 (Ex. 25b1) | 48 | 1.25 | 1.28 | 0.47 | 2.03 | 2.03 | 2.86 | 4.7 | 6.5 | 13 |
| 150 (Ex. 25b1) | 120 | 0.67 | 0.61 | 0.42 | 2.63 | 2.64 | 2.79 | 15 | 23 | 17 |

As can be seen from the data in Table 8, Examples 25b1 to 25b11 containing DBU treated phosphors dried under different conditions resulted in different DBU concentrations on the surface of the treated phosphor. Higher drying temperatures and longer drying times drive off more DBU from the surface of the treated phosphor than do lower drying temperatures and/or shorter drying times. Driving off too much DBU may result in a treated phosphor that, when used in a film of a condensation curable silicone composition, the film has a slower cure speed. Eventually when the drying temperature is too high and/or the drying time is too long relative to the boiling point and/or vapor pressure of the DBU, so much of the DBU will de-sorb from the surface of the treated phosphor that the treated phosphor has been over-dried. A film of the condensation curable silicone composition prepared with the over-dried treated phosphor may not exhibit enhanced cure speed. This absence of enhanced cure speed may be due to the over-dried treated phosphor having too many free acidic sites such that the over-dried treated phosphor adsorbs too much of the 5 ppm of added DBU condensation catalyst used in the film. To restore the enhanced cure speed to the film using the over-dried treated phosphor, additional ppm of DBU condensation catalyst may be added to the condensation curable silicone composition, and a film prepared therefrom will have enhanced cure speed. As described earlier, there is an optimal treatment condition wherein the treated phosphor described or portions thereof, but it is recognized that various modifications are possible within the scope of the embodiments of the present invention. Thus, it should be understood that although the present invention has been specifically disclosed by specific embodiments and optional features, modification and variation of the concepts herein disclosed may be resorted to by those of ordinary skill in the art, and that such modifications and variations are considered to be within the scope of embodiments of the present invention.

The below claims are incorporated by reference here, and the terms "claim" and "claims" are replaced by the term "aspect" or "aspects," respectively. Embodiments of the invention also include these resulting numbered aspects.

What is claimed is:

1. A condensation curable silicone composition comprising:
   a condensation curable polyorganosiloxane; and
   treated particles comprising a particulate solid having an effective amount of nitrogen-containing superbase disposed thereon;
   wherein the effective amount of nitrogen-containing superbase disposed on the particulate solid is sufficient to neutralize a substantial number of a plurality of acidic sites on the particulate solid and a substantial number of the acidic sites on the particulate solid are neutralized with the disposed nitrogen-containing superbase.

2. The condensation curable silicone composition of claim 1, wherein the effective amount of nitrogen-containing superbase disposed on the particulate solid is sufficient so that the time necessary for the condensation curable silicone composition to cure and reach a tan delta value equal to 1 is from about 30 seconds to about 1 hour at 150° C.

3. The condensation curable silicone composition of claim 1, wherein the particulate solid is a particulate phosphor.

4. The condensation curable silicone composition of claim 3, wherein the particulate phosphor comprises at least one of a cerium-doped phosphor, aluminate phosphor, a silicate phosphor, a garnet phosphor, and a nitride phosphor.

5. The condensation curable composition of claim 1 wherein the nitrogen-containing superbase is a cycloaliphatic imines of the general formula:

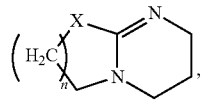

wherein X is $CH_2$ or NR, wherein R is hydrogen, alkyl or aryl; and subscript n is an integer from 1 to 3.

6. The condensation curable silicone composition of claim 1, wherein the nitrogen-containing superbase is at least one of:
1,8-Diazabicyclo[5.4.0]undec-7-ene (DBU);
1,5,7-Triazabicyclo[4.4.0]dec-5-ene (TBD);
1,5-Diazabicyclo[4.3.0]-5-nonene (DBN); and
7-Methyl-1,5,7-triazabicyclo[4.4.0]dec-5-ene (MTBD).

7. The condensation curable silicone composition of claim 1 further comprising a catalytically effective amount of a condensation catalyst, wherein the total amount of the nitrogen-containing base disposed on the particulate solid of the treated particles plus the catalytically effective amount of a condensation catalyst disposed in the condensation curable silicone composition is such that the time necessary for the condensation curable silicone composition to cure and reach a tan delta value=1 is at least 30 seconds, but not so much that the time is greater than 65 minutes at 150° C.

8. The condensation curable silicone composition of claim 1 wherein the nitrogen-containing superbase also functions as a condensation catalyst.

9. The condensation curable silicone composition of claim 1, wherein the condensation curable polyorganosiloxane comprises an organosiloxane block copolymer comprising:
0 to 10 mole percent M constituent units of the formula $[R_3SiO_{1/2}]$,
40 to 90 mole percent D constituent units of the formula $[R_2SiO_{2/2}]$,
10 to 60 mole percent T constituent units of the formula $[RSiO_{3/2}]$, and
0.5 to 35 mole percent silicon bonded hydroxy (SiOH);
wherein:
the sum of the mole percent M, D, and T constituent units is 100 mole percent;
each R is independently a $C_1$ to $C_{30}$ hydrocarbyl;
the D constituent units $[R_2SiO_{2/2}]$ are arranged in linear blocks having an average of from 50 to 300 D constituent units $[R_2SiO_{2/2}]$ per linear block;
the T constituent units $[RSiO_{3/2}]$ are arranged in non-linear blocks having a block weight of at least 500 g/mole;

the M constituent units $[R_3SiO1/2]$ are connected to T units;
at least 30% of the non-linear blocks are crosslinked with each other;
each linear block is linked to at least one non-linear block via —Si—O—Si— linkages; and
the organosiloxane block copolymer has a weight average molecular weight of at least 20,000 g/mole.

10. A cured product of condensation curing the condensation curable silicone composition of claim 1.

11. A method for treating particulate solid having a plurality of acidic sites, the method comprising:
contacting the particulate solid with a nitrogen-containing superbase to give treated particles having an excess amount of nitrogen-containing superbase disposed thereon, wherein the amount of nitrogen-containing superbase is disposed on the particulate solid and is sufficient to neutralize a substantial number of a plurality of acidic sites on the particulate solid wherein the particulate solid is a particulate phosphor and the treated particles are treated phosphor particles.

12. The method of claim 11 further comprising:
isolating the treated particles having an excess amount of nitrogen-containing superbase disposed thereon to give isolated treated particles having an excess amount of nitrogen-containing superbase disposed thereon;
processing the isolated treated particles having an excess amount of nitrogen-containing superbase disposed thereon to remove therefrom a portion, but not all, of disposed nitrogen-containing superbase to give processed treated particles having an effective amount of nitrogen-containing base disposed thereon;
wherein the processing comprises heating the isolated treated particles having an excess amount of nitrogen-containing superbase disposed thereon at a temperature and for a time sufficient to remove therefrom the portion, but not all, of disposed nitrogen-containing superbase to give processed treated particles such that the time necessary for a condensation curable silicone composition comprising the processed treated particles having an amount of nitrogen-containing superbase disposed thereon to cure and reach a tan delta value equal to 1 is from about 30 seconds to about 1 hour at 150° C.

13. A method for treating a curable polyorganosiloxane particle-containing composition, the method comprising:
treating a composition comprising the condensation curable polyorganosiloxane and untreated particles with a solution comprising a solvent and a nitrogen-containing superbase in an effective amount sufficient to neutralize a substantial number of a plurality of acidic sites on the untreated particles;
wherein the solution comprising the nitrogen-containing superbase does not substantially dissolve the condensation curable polyorganosiloxane.

14. Treated phosphor particles comprising a particulate phosphor having an effective amount of nitrogen-containing superbase disposed thereon; wherein the effective amount of nitrogen-containing superbase disposed on the particulate phosphor is sufficient to neutralize a substantial number of a plurality of acidic sites on the particulate phosphor and a substantial number of the acidic sites on the particulate phosphor are neutralized with the disposed nitrogen-containing superbase; and wherein the nitrogen-containing superbase is a cycloaliphatic imines of the general formula:

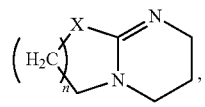

wherein X is CH$_2$ or NR, wherein R is hydrogen, alkyl or aryl; and subscript n is an integer from 1 to 3.

15. The treated phosphor particles of claim 14, wherein the nitrogen-containing superbase is at least one of:
1,8-Diazabicyclo[5.4.0]undec-7-ene (DBU);
1,5,7-Triazabicyclo[4.4.0]dec-5-ene (TBD);
1,5-Diazabicyclo[4.3.0]-5-nonene (DBN); and
7-Methyl-1,5,7-triazabicyclo[4.4.0]dec-5-ene (MTBD).

16. The treated phosphor particles of claim 14 wherein the treated phosphor particles are in the form of an isolated powder.

17. The treated phosphor particles of claim 14 wherein the treated phosphor particles have been further processed to remove some, but not all, of the superbase therefrom to give processed treated phosphor particles that contain some superbase disposed thereon and do not contain a monolithic coating or film of the superbase on the surface of the phosphor particles.

* * * * *